(12) United States Patent
Pan et al.

(10) Patent No.: US 8,045,832 B2
(45) Date of Patent: Oct. 25, 2011

(54) MODE SIZE CONVERTER FOR A PLANAR WAVEGUIDE

(75) Inventors: Tao Pan, San Jose, CA (US); Richard E. Demaray, Portola Valley, CA (US); Yu Chen, San Jose, CA (US); Yong Jin Xie, Cupertino, CA (US); Rajiv Pethe, San Jose, CA (US)

(73) Assignee: SpringWorks, LLC, Minnetonka, MN (US)

( * ) Notice: Subject to any disclaimer, the term of this patent is extended or adjusted under 35 U.S.C. 154(b) by 0 days.

(21) Appl. No.: 11/100,856

(22) Filed: Apr. 6, 2005

(65) Prior Publication Data

US 2005/0175287 A1 Aug. 11, 2005

Related U.S. Application Data

(62) Division of application No. 10/101,492, filed on Mar. 16, 2002, now Pat. No. 6,884,327.

(51) Int. Cl.
*G02B 6/26* (2006.01)
(52) U.S. Cl. ......................................................... 385/43
(58) Field of Classification Search .................. None
See application file for complete search history.

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,850,604 A | 11/1974 | Klein | |
| 4,082,569 A | 4/1978 | Evans, Jr. | |
| 4,111,523 A | 9/1978 | Kaminow et al. | |
| 4,437,966 A | 3/1984 | Hope et al. | |
| 4,587,225 A | 5/1986 | Tsukuma et al. | |
| 4,619,680 A | 10/1986 | Nourshargh et al. | |
| RE32,449 E | 6/1987 | Claussen | |
| 4,710,940 A | 12/1987 | Sipes, Jr. | |
| 4,785,459 A | 11/1988 | Baer | |
| 4,812,712 A | 3/1989 | Ohnishi et al. | |
| 4,915,810 A | 4/1990 | Kestigian et al. | |
| 4,978,437 A | 12/1990 | Wirz | |
| 5,078,516 A * | 1/1992 | Kapon et al. ................... 385/129 |
| 5,085,904 A | 2/1992 | Deak et al. | |
| 5,107,538 A | 4/1992 | Benton et al. | |
| 5,119,460 A | 6/1992 | Bruce et al. | |
| 5,173,271 A | 12/1992 | Chen et al. | |
| 5,174,876 A | 12/1992 | Buchal et al. | |

(Continued)

FOREIGN PATENT DOCUMENTS

DE 37 38 738 C1 1/1989

(Continued)

OTHER PUBLICATIONS

Alder, T. et al., "High-Efficiency Fiber-to-Chip Coupling Using Low-Loss Tapered Single-Mode Fiber," *IEEE Photonics Technology Letters*, 12(8):1016-1018 (2000).

(Continued)

*Primary Examiner* — Timothy Rude
(74) *Attorney, Agent, or Firm* — Haynes and Boone, LLP

(57) ABSTRACT

A process for forming a mode size converter with an out-of-plane taper formed during deposition with a shadow mask is disclosed. Mode-size converters according to the present invention can have any number of configurations. Measured coupling efficiencies for waveguides with mode size converters according to the present invention show marked improvement.

8 Claims, 13 Drawing Sheets

U.S. PATENT DOCUMENTS

| | | | |
|---|---|---|---|
| 5,196,041 A | 3/1993 | Tumminelli et al. |
| 5,200,029 A | 4/1993 | Bruce et al. |
| 5,206,925 A | 4/1993 | Nakazawa et al. |
| 5,225,288 A | 7/1993 | Beeson et al. |
| 5,237,439 A | 8/1993 | Misono et al. |
| 5,252,194 A | 10/1993 | Demaray et al. |
| 5,287,427 A | 2/1994 | Atkins et al. |
| 5,296,089 A | 3/1994 | Chen et al. |
| 5,303,319 A | 4/1994 | Ford et al. |
| 5,306,569 A | 4/1994 | Hiraki |
| 5,309,302 A | 5/1994 | Vollmann |
| 5,338,625 A | 8/1994 | Bates et al. |
| 5,355,089 A | 10/1994 | Treger |
| 5,362,672 A | 11/1994 | Ohmi et al. |
| 5,381,262 A | 1/1995 | Arima et al. |
| 5,427,669 A | 6/1995 | Drummond |
| 5,433,835 A | 7/1995 | Demaray |
| 5,435,826 A | 7/1995 | Sakakibara et al. |
| 5,457,569 A | 10/1995 | Liou et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,499,207 A | 3/1996 | Miki et al. |
| 5,512,147 A | 4/1996 | Bates et al. |
| 5,538,796 A | 7/1996 | Schaffer et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,569,520 A | 10/1996 | Bates |
| 5,591,520 A | 1/1997 | Migliorini et al. |
| 5,597,660 A | 1/1997 | Bates et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,613,995 A | 3/1997 | Bhandarkar et al. |
| 5,645,626 A | 7/1997 | Edlund et al. |
| 5,654,054 A | 8/1997 | Tropsha et al. |
| 5,654,984 A | 8/1997 | Hershbarger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,718,813 A | 2/1998 | Drummond |
| 5,719,976 A | 2/1998 | Henry et al. |
| 5,731,661 A | 3/1998 | So et al. |
| 5,738,731 A | 4/1998 | Shindo et al. |
| 5,755,938 A | 5/1998 | Fukui et al. |
| 5,757,126 A | 5/1998 | Harvey, III et al. |
| 5,761,234 A | 6/1998 | Craig et al. |
| 5,762,768 A | 6/1998 | Goy et al. |
| 5,771,562 A | 6/1998 | Harvey, III et al. |
| 5,789,071 A | 8/1998 | Sproul et al. |
| 5,792,550 A | 8/1998 | Phillips et al. |
| 5,811,177 A | 9/1998 | Shi et al. |
| 5,830,330 A | 11/1998 | Lantsman |
| 5,831,262 A | 11/1998 | Greywall et al. |
| 5,841,931 A | 11/1998 | Foresi et al. |
| 5,847,865 A | 12/1998 | Gopinath et al. |
| 5,849,163 A | 12/1998 | Ichikawa et al. |
| 5,853,830 A | 12/1998 | McCaulley et al. |
| 5,855,744 A | 1/1999 | Halsey et al. |
| 5,870,273 A | 2/1999 | Sogabe et al. |
| 5,882,946 A | 3/1999 | Otani |
| 5,900,057 A | 5/1999 | Buchal et al. |
| 5,909,346 A | 6/1999 | Malhotra et al. |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,952,778 A | 9/1999 | Haskal et al. |
| 5,961,682 A | 10/1999 | Lee et al. |
| 5,966,491 A | 10/1999 | DiGiovanni |
| 5,972,516 A | 10/1999 | Kaneko et al. |
| 5,977,582 A | 11/1999 | Fleming et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,024,844 A | 2/2000 | Drummond et al. |
| 6,045,626 A | 4/2000 | Yano et al. |
| 6,046,081 A | 4/2000 | Kuo |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,077,642 A | 6/2000 | Ogata et al. |
| 6,080,643 A | 6/2000 | Noguchi et al. |
| 6,088,492 A | 7/2000 | Kaneko et al. |
| 6,093,944 A | 7/2000 | VanDover |
| 6,106,933 A | 8/2000 | Nagai et al. |
| 6,117,279 A | 9/2000 | Smolanoff et al. |
| 6,125,225 A * | 9/2000 | Dianov et al. ............. 385/124 |
| 6,133,670 A | 10/2000 | Rodgers et al. |
| 6,146,225 A | 11/2000 | Sheats et al. |
| 6,154,582 A | 11/2000 | Bazylenko et al. |
| 6,157,765 A | 12/2000 | Bruce et al. |
| 6,162,709 A | 12/2000 | Raoux et al. |
| 6,165,566 A | 12/2000 | Tropsha |
| 6,168,884 B1 | 1/2001 | Neudecker et al. |
| 6,176,986 B1 | 1/2001 | Watanabe et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 | 5/2001 | Hata et al. |
| 6,236,793 B1 | 5/2001 | Lawrence et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,640 B1 | 6/2001 | Nam |
| 6,261,917 B1 | 7/2001 | Quek et al. |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,287,986 B1 | 9/2001 | Mihara |
| 6,288,835 B1 | 9/2001 | Nilsson et al. |
| 6,290,821 B1 | 9/2001 | McLeod |
| 6,290,822 B1 | 9/2001 | Fleming et al. |
| 6,293,688 B1 * | 9/2001 | Deacon ..................... 362/556 |
| 6,300,215 B1 | 10/2001 | Shin |
| 6,302,939 B1 | 10/2001 | Rabin et al. |
| 6,306,265 B1 | 10/2001 | Fu et al. |
| 6,344,419 B1 | 2/2002 | Forster et al. |
| 6,350,353 B2 | 2/2002 | Gopalraja et al. |
| 6,356,694 B1 | 3/2002 | Weber |
| 6,358,810 B1 | 3/2002 | Dornfest et al. |
| 6,361,662 B1 | 3/2002 | Chiba et al. |
| 6,365,300 B1 | 4/2002 | Ota et al. |
| 6,365,319 B1 | 4/2002 | Heath et al. |
| 6,376,027 B1 | 4/2002 | Lee et al. |
| 6,396,984 B1 * | 5/2002 | Cho et al. ..................... 385/43 |
| 6,409,965 B1 | 6/2002 | Nagata et al. |
| 6,411,764 B1 * | 6/2002 | Lee ..................... 385/131 |
| 6,413,382 B1 | 7/2002 | Wang et al. |
| 6,413,645 B1 | 7/2002 | Graff et al. |
| 6,416,598 B1 | 7/2002 | Sircar |
| 6,423,776 B1 | 7/2002 | Akkapeddi et al. |
| 6,433,380 B2 | 8/2002 | Shin |
| 6,444,750 B1 | 9/2002 | Touhsaent |
| 6,452,717 B1 | 9/2002 | Endo |
| 6,488,822 B1 | 12/2002 | Moslehi |
| 6,506,289 B2 | 1/2003 | Demaray et al. |
| 6,511,615 B1 | 1/2003 | Dawes et al. |
| 6,533,907 B2 | 3/2003 | Demaray et al. |
| 6,537,428 B1 | 3/2003 | Xiong et al. |
| 6,549,688 B2 | 4/2003 | Bazylenko |
| 6,563,998 B1 | 5/2003 | Farah et al. |
| 6,576,546 B2 | 6/2003 | Gilbert et al. |
| 6,602,338 B2 | 8/2003 | Chen et al. |
| 6,605,228 B1 | 8/2003 | Kawaguchi et al. |
| 6,615,614 B1 | 9/2003 | Makikawa et al. |
| 6,632,563 B1 | 10/2003 | Krasnov et al. |

| | | | | | | |
|---|---|---|---|---|---|---|
| 6,641,704 | B2 | 11/2003 | Someno | EP | 0 820 088 A2 | 1/1998 |
| 6,673,716 | B1 | 1/2004 | D'Couto et al. | EP | 0 867 985 B1 | 2/1998 |
| 6,683,244 | B2 | 1/2004 | Fujimori et al. | EP | 1 068 899 A1 | 1/2001 |
| 6,683,749 | B2 | 1/2004 | Daby et al. | EP | 1 092 689 A1 | 4/2001 |
| 6,690,868 | B2* | 2/2004 | Donalds et al. ............... 385/123 | EP | 1 189 080 A2 | 3/2002 |
| 6,750,156 | B2 | 6/2004 | Le et al. | JP | 61-60803 | 3/1986 |
| 6,751,241 | B2 | 6/2004 | Davis et al. | JP | 62-287071 | 12/1987 |
| 6,760,520 | B1* | 7/2004 | Medin et al. .................. 385/43 | JP | 2-054764 A2 | 2/1990 |
| 6,768,855 | B1* | 7/2004 | Bakke et al. .................. 385/129 | JP | 5-230642 A | 9/1993 |
| 6,818,356 | B1 | 11/2004 | Bates | JP | 6-010127 A | 1/1994 |
| 6,827,826 | B2 | 12/2004 | Demaray et al. | JP | 6-100333 A | 4/1994 |
| 6,846,765 | B2 | 1/2005 | Imamura et al. | JP | 7-233469 A | 5/1995 |
| 6,884,327 | B2* | 4/2005 | Pan et al. .................. 204/192.12 | JP | 7-224379 | 8/1995 |
| 7,218,809 | B2* | 5/2007 | Zhou et al. ..................... 385/28 | KR | 2002-26187 | 4/2002 |
| 7,340,124 | B2 | 3/2008 | Patel et al. | WO | WO 96/23085 A1 | 8/1996 |
| 7,378,356 | B2 | 5/2008 | Zhang et al. | WO | WO 97/35044 A1 | 9/1997 |
| 7,381,657 | B2 | 6/2008 | Zhang et al. | WO | WO 99/61674 A1 | 12/1999 |
| 7,413,998 | B2 | 8/2008 | Zhang et al. | WO | WO 00/21898 A1 | 4/2000 |
| 7,469,558 | B2 | 12/2008 | Demaray et al. | WO | WO 00/22742 A2 | 4/2000 |
| 7,544,276 | B2 | 6/2009 | Zhang et al. | WO | WO 00/36665 A1 | 6/2000 |
| 7,826,702 | B2 | 11/2010 | Dawes | WO | WO 01/82297 A1 | 11/2001 |
| 2001/0027159 | A1 | 10/2001 | Kaneyoshi | WO | WO 02/12932 A2 | 2/2002 |
| 2001/0031122 | A1 | 10/2001 | Lackritz et al. | WO | WO 2004/021532 A1 | 3/2004 |
| 2001/0041460 | A1 | 11/2001 | Wiggins | WO | WO 2004/077519 A2 | 9/2004 |
| 2002/0001746 | A1 | 1/2002 | Jenson | WO | WO 2004/106581 A2 | 12/2004 |
| 2002/0014406 | A1 | 2/2002 | Takashima | WO | WO 2004/106582 A2 | 12/2004 |
| 2002/0033330 | A1 | 3/2002 | Demaray et al. | WO | WO 2006/063308 A2 | 6/2006 |
| 2002/0076133 | A1* | 6/2002 | Li et al. ............................ 385/16 | | | |
| 2002/0100413 | A1* | 8/2002 | Kim et al. ........................ 117/94 | | | |
| 2002/0106297 | A1 | 8/2002 | Ueno et al. | | | |
| 2002/0115252 | A1 | 8/2002 | Haukka et al. | | | |
| 2002/0134671 | A1 | 9/2002 | Demaray et al. | | | |
| 2002/0140103 | A1 | 10/2002 | Kloster et al. | | | |
| 2002/0141682 | A1* | 10/2002 | Ryu et al. ........................ 385/14 | | | |
| 2002/0170821 | A1 | 11/2002 | Sandlin et al. | | | |
| 2002/0191916 | A1* | 12/2002 | Frish et al. ...................... 385/43 | | | |
| 2003/0007718 | A1 | 1/2003 | Bazylenko | | | |
| 2003/0019326 | A1 | 1/2003 | Han et al. | | | |
| 2003/0022487 | A1 | 1/2003 | Yoon et al. | | | |
| 2003/0035906 | A1 | 2/2003 | Memarian et al. | | | |
| 2003/0042131 | A1 | 3/2003 | Johnson | | | |
| 2003/0044118 | A1 | 3/2003 | Zhou et al. | | | |
| 2003/0063629 | A1 | 4/2003 | Davis et al. | | | |
| 2003/0063883 | A1 | 4/2003 | Demaray et al. | | | |
| 2003/0077914 | A1 | 4/2003 | Le et al. | | | |
| 2003/0079838 | A1 | 5/2003 | Brcka | | | |
| 2003/0097858 | A1 | 5/2003 | Strohhofer et al. | | | |
| 2003/0127319 | A1 | 7/2003 | Demaray et al. | | | |
| 2003/0134054 | A1 | 7/2003 | Demaray et al. | | | |
| 2003/0141186 | A1 | 7/2003 | Wang et al. | | | |
| 2003/0173207 | A1* | 9/2003 | Zhang et al. ............. 204/192.12 | | | |
| 2003/0173208 | A1* | 9/2003 | Pan et al. .................. 204/192.26 | | | |
| 2003/0174391 | A1 | 9/2003 | Pan et al. | | | |
| 2003/0175142 | A1 | 9/2003 | Milonopoulou et al. | | | |
| 2003/0178637 | A1 | 9/2003 | Chen et al. | | | |
| 2003/0185266 | A1 | 10/2003 | Henrichs | | | |
| 2004/0043557 | A1 | 3/2004 | Haukka et al. | | | |
| 2004/0077161 | A1 | 4/2004 | Chen et al. | | | |
| 2004/0105644 | A1 | 6/2004 | Dawes | | | |
| 2004/0208454 | A1* | 10/2004 | Montgomery et al. ......... 385/50 | | | |
| 2004/0259305 | A1 | 12/2004 | Demaray et al. | | | |
| 2005/0000794 | A1 | 1/2005 | Demaray et al. | | | |
| 2005/0006768 | A1 | 1/2005 | Narasimhan et al. | | | |
| 2005/0048802 | A1 | 3/2005 | Zhang et al. | | | |
| 2005/0105853 | A1* | 5/2005 | Liu et al. ........................ 385/43 | | | |
| 2005/0183946 | A1* | 8/2005 | Pan et al. .................. 204/192.26 | | | |
| 2005/0225839 | A1 | 10/2005 | Patel et al. | | | |
| 2006/0054496 | A1 | 3/2006 | Zhang et al. | | | |
| 2006/0057283 | A1 | 3/2006 | Zhang et al. | | | |
| 2006/0057304 | A1 | 3/2006 | Zhang et al. | | | |
| 2006/0071592 | A1 | 4/2006 | Narasimhan et al. | | | |
| 2006/0134522 | A1 | 6/2006 | Zhang et al. | | | |
| 2007/0263676 | A1 | 11/2007 | Beukema et al. | | | |
| 2008/0107376 | A1 | 5/2008 | Patel et al. | | | |

FOREIGN PATENT DOCUMENTS

| | | |
|---|---|---|
| EP | 0 510 883 A2 | 10/1992 |
| EP | 0 639 655 A1 | 2/1995 |
| EP | 0 652 308 A2 | 5/1995 |

OTHER PUBLICATIONS

Almeida, Vilson R. et al., "Nanotaper for compact mode conversion," *Optics Letters*, 28(15):1302-1304 (2003).

Itoh, M. et al., "Large reduction of singlemode-fibre coupling loss in 1.5% delta planar lightwave circuits using spot-size converters," *Electronics Letters*, 38(2):72-74 (2002).

Johnson, J.E. et al., "Monolithically Integrated Semiconductor Optical Amplifier and Electroabsorption Modulator with Dual-Waveguide Spot-Size Converter Input," *IEEE Journal of Selected Topics in Quantum Electronics*, 6(1):19-25, (2000).

Kato, Kuniharu et al., "PLC Hybrid Integration Technology and Its Application to Photonic Components," *IEEE Journal of Selected Topics in Quantum Electronics*, 6(1):4-13 (2000).

Ladouceur, F. et al., "8.8 Evaluation of Results" *Silica-based Buried Channel Waveguides and Devices*, Chapman & Hall, London, pp. 98-99 (1996).

Love, J.D. et al., "Quantifying Loss Minimisation in Single-Mode Fibre Tapers," *Electronics Letters*, 22(17):912-914, (1986).

Mitomi, O. et al., Design of a Single-Mode Tapered Waveguide for Low-Loss Chip-to-Fiber Coupling,: *IEEE Journal of Quantum Electronics*, 30(8):1787-1793, (1994).

Rajarajan, M. et al., "Numerical Study of Spot-Zise Expanders for an Efficient OEIC to SMF Coupling," *IEEE Photonics Technology Letters*, 10(8):1082-1084, (1998).

Sewell, P. et al., "Rib Waveguide Spot-Size Transformers: Modal Properties," *Journal of Lightwave Technology*, 17(5):848-856, (1999).

Smith, R.E., "Reduced Coupling Loss Using a Tapered-Rib Adiabatic-Following Fiber Coupler," *IEEE Photonics Technology Letters*, 8(8):1052-1054 (1996).

Yanagawa, H. et al., "Index-and-Dimensional Taper and Its Application to Photonic Devices," *Journal of Lightwave Technology*, 10(5):587-591 (1992).

Affinito, J.D. et al., "PML/oxide/PML Barrier Layer Performance Differences Arising from Use of UV or Electron Beam Polymerization of the PML Layers," *Thin Solid Films* 308-309:19-25 (1997).

Affinito, J.D. et al., "Polymer-Oxide Transparent Barrier Layers," Society of Vacuum Coaters, 39th Ann. Technical Conference Proceedings, May 5-10, 1996, Philadelphia, PA, pp. 392-397 (1996).

Asghari, M. and Dawnay, E., "ASOC™—A Manufacturing Integrated Optics Technology," *SPIE* 3620:252-262 (Jan. 1999).

Barbier, D. et al, "Amplifying Four-Wavelength Combiner, Based on Erbium/Ytterbium-Doped Waveguide Amplifiers and Integrated Splitters," *IEEE Photonics Tech. Lett.*.9:315-317 (1997).

Barbier, D., "Performances and potential applications of erbium doped planar waveguide amplifiers and lasers," *Proc. OAA*, Victoria, BC, Canada, pp. 58-63 (Jul. 21-23, 1997).

Beach R.J., "Theory and optimization of lens ducts," *Applied Optics* 35(12):2005-2015 (1996).

Belkind, A. et al., "Using pulsed direct current power for reactive sputtering of $Al_2O_3$," *J. Vac. Sci. Technol. A* 17(4):1934-1940 (1999).

Bestwick, T., "ASOC™ silicon integrated optics technology," *SPIE* 3631:182-190 (1999).

Borsella, E. et al., "Structural incorporation of silver in soda-lime glass by the ion-exchange process: A photoluminescence spectroscopy study," *Applied Physics A* 71:125-132 (2000).

Byer, R.L., "Nonlinear Optics and Solid-state Lasers: 2000," *IEEE J. Selected Topics in Quantum Electronics* 6(6):911-930 (2000).

Campbell, S.A. et al., "Titanium dioxide ($TiO_2$)-based gate insulators," *IBM J. Res. Develop.* 43(3):383-392 (1999).

Chang, C.Y. and Sze, S.M. (Eds.), in: *ULSI Technology*, The McGraw-Hill Companies, Inc., New York, Chapter 4, pp. 169-170, and 226-231 (1996).

Chen, G. et al. "Development of Supported Bifunctional Electrocatalysts for Unitized Regenerative Fuel Cells," *J. Electrochemical Society* 149(8):A1092-A1099 (2002).

Choi, Y.B. et al., "Er-Al-codoped silicate planar light waveguide-type amplifier fabricated by radio-frequency sputtering," *Optics Letters* 25(4):263-265 (2000).

Cooksey, K. et al. "Predicting Permeability & Transmission Rate for Multilayer Materials," *Food Technology* 53(9):60-63 (1999).

Crowder, M.A. et al., "Low-Temperature Single-Crystal Si TFT's Fabricated on Si Films Processed via Sequential Lateral Solidification," *IEEE Electron Device Lett.* 19(8):306-308 (1998).

Delavaux, J-M. et al., "Integrated optics erbium ytterbium amplifier system in 10Gb/s fiber transmission experiment," 22nd European Conference on Optical Communication, Oslo, I.123-I.126 (1996).

Distributed Energy Resources: Fuel Cells, Projects, 4 pages http://www.eere.energy.gov/der/fuel_cells/projects.html (2003).

Dorey, R.A., "Low temperature micromoulding of functional ceramic devices," Grant summary for GR/S84156/01 for the UK Engineering and Physical Sciences Research Council, 2 pages (2004).

DuPont Teijin Films, Mylar 200 SBL 300, Product Information, 4 pages (2000).

Electrometals Technologies Limited, Financial Report for 2002, Corporate Directory, Chairman's Review, Review of Operations, 10 pages (2002).

E-Tek website: FAQ, Inside E-Tek, E-Tek News, Products; http://www.etek-inc.com/, 10 pages (2003).

Flytzanis, C. et al, "Nonlinear Optics in Composite Materials," in: *Progress in Optics XXIX*, Elsevier Science Publishers B.V., pp. 323-425 (1991).

Frazao, O. et al., "EDFA Gain Flattening Using Long-Period Fibre Gratings Based on the Electric Arc Technique," *Proc. London Comm. Symp. 2001*, London, England, 3 pages (2001).

Fujii, M. et al., "1.54 µm photoluminescence of $Er^{3+}$ doped into $SiO_2$ films containing Si nanocrystals: Evidence for energy transfer from Si nanocrystals for $Er^{3+}$," *Appl. Phys. Lett.* 71(9):1198-1200 (1997).

Garcia, C. et al. "Size Dependence of Lifetime and Absorption Cross Section of Si Nanocrystals Embedded in $SiO_2$," *Appl. Phys. Lett.* 82(10):1595-1597 (2003).

Goossens, A. et al., "Sensitization of $TiO_2$ with p-type semiconductor polymers," *Chem. Phys. Lett.* 287:148 (1998).

Greene, J.E. et al., "Morphological and electrical properties of rf sputtered $Y_2O_3$-doped $ZrO_2$ thin films," *J. Vac. Sci. Tech.* 13(1):72-75 (1976).

Han, H.-S. et al. "Optical Gain at 1.54 µm in Erbium-Doped Silicon Nanocluster Sensitized Waveguide," *Appl. Phys. Lett.* 79(27):4568-4570 (2001).

Hayakawa, T. et al., "Enhanced fluorescence from $Eu^{3+}$ owing to surface plasma oscillation of silver particles in glass," *J. Non-Crystalline Solids* 259:16-22 (1999).

Hayakawa, T. et al, "Field enhancement effect of small Ag particles on the fluorescence from $Eu^{3+}$-doped $SiO_2$ glass," *Appl. Phys. Lett.* 74(11):1513-1515 (1999).

Hayfield, P.C.S., in: *Development of a New Material-Monolithic $Ti_4O_7$ Ebonix® Ceramic*, Royal Society of Chemistry, Cambridge, Table of Contents, 4 pages (2002).

Hehlen, M.P. et al. "Spectroscopic Properties of $Er^{3+}$-and $Yb^{3+}$-doped Soda-Lime Silicate and Aluminosilicate Glasses," *Physical Review B* 56(15):9302-9318 (1997).

Hehlen, M.P. et al. "Uniform Upconversion in High-Concentration $Er^{3+}$-doped Soda Lime. Silicate and Aluminosilicate Glasses," *Optics Letters* 22(11):772-774 (1997).

Horst, F. et al., "Compact, Tunable Optical Devices in Silicon-Oxynitride Waveguide Technology," *Top. Meeting Integrated Photonics Res. '00*, Quebec, Canada, p. IThF1, 3 pages (2000).

Howson, R.P., "The reactive sputtering of oxides and nitrides," *Pure & Appl. Chem.* 66(6):1311-1318 (1994).

Hubner, J. and Guldberg-Kjaer, S., "Planar Er-and Yb-Doped Amplifiers and Lasers," COM Technical University of Denmark, 10th European Conf. on Integrated Optics, Session WeB2, pp. 71-74 (2001).

Hwang, M-S. et al., "The effect of pulsed magnetron sputtering on the properties of indium tin oxide thin films," *Surface and Coatings Tech.* 171:29-33 (2003).

Im, J.S. et al. "Controlled Super-Lateral Growth of Si Films for Microstructural Manipulation and Optimization," *Physica Status Solidi (A)* 166(2):603-617 (1998).

Im, J.S. and Sposili, R.S., "Crystalline Si Films for Integrated Active-Matrix Liquid Crystal Displays," *MRS Bulletin*, pp. 39-48 (1996).

Im, J.S. et al., "Single-crystal Si films for thin-film transistor devices," *Appl. Physics Lett.* 70(25):3434-3436 (1997).

Jackson, M.K. and Movassaghi, M., "An Accurate Compact EDFA Model," Eur. Conf. Optical Comm., Munich, Germany, 2 pages (2000).

Janssen, R. et al. "Photoinduced electron transfer from conjugated polymers onto nanocrystalline $TiO_2$," Synthet. Metal., 1 page (1999).

Jonsson L.B. et al. "Frequency response in pulsed DC reactive sputtering processes," *Thin Solid Films* 365:43-48 (2000).

Kato, K. and Inoue, Y., "Recent progress on PLC hybrid integration," *SPIE*. 3631:28-36 (1999).

Kato, K. and Tohmori, Y., "PLC Hybrid Integration Technology and Its Application to Photonic Components," *IEEE J. Selected Topics in Quantum Electronics* 6(1):4-13 (2000).

Kelly, P.J. et al., "Reactive pulsed magnetron sputtering process for alumina films," *J. Vac. Sci. Technol. A* 18(6):2890-2896 (2000).

Kelly, P.J. and Arnell, R.D., "Control of the structure and properties of aluminum oxide coatings deposited by pulsed magnetron sputtering," *J. Vac. Sci. Technol. A* 17(3):945-953 (1999).

Kik, P.G. and Polman, A., "Gain Limiting Processes in Er-doped Si Nanocrystal Waveguides in $SiO_2$," *J. Appl. Phys.* 91(1):534-536 (2002).

Kim, H-K. and Yoon, Y., "Characteristics of rapid-thermal-annealed $LiCoO_2$ cathode film for an all-solid-state thin film microbattery," *J. Vac. Sci. Technol. A* 22(4):1182-1187 (2004).

Kim, J-Y. et al. "Frequency-dependent pulsed direct current magnetron sputtering of titanium oxide films," *J. Vac. Sci. Technol. A* 19(2):429-434 (2001).

Kim, D-W. et al. "Mixture Behavior and Microwave Dielectric Properties in the Low-fired $TiO_2$-CuO System," *Jpn. J. Appl. Phys.* 39:2696-2700 (2000).

Ladouceur, F. et al., "Effect of side wall roughness in buried channel waveguides," *IEEE Proc. Optoelectron.* 141(4):242-248 (1994).

Lamb, W.B., "Designing Nonfoil Containing Skins for VIP Applications," DuPont VIA Symposium Presentation, 35 pages (1999).

Lamb, W. and Zeiler, R., "Designing Non-Foil Containing Skins for Vacuum Insulation Panel (VIP) Applications," *Vuoto XXVIII*(1-2):55-58 (1999).

Lange, M.R. et al, "High Gain Ultra-Short Length Phosphate glass Erbium-Doped Fiber Amplifier Material," OSA Optical Fiber Communications (OFC), 3 pages (2002).

Laporta, P. et al, "Diode-pumped cw bulk Er:Yb:glass laser," *Optics Letters* 16(24):1952-1954 (1991).

Laurent-Lund, C. et al., "PECVD Grown Multiple Core Planar Waveguides with Extremely Low Interface Reflections and Losses," *IEEE Photonics Tech. Lett.* 10(10):1431-1433 (1998).

Lee, K.K. et al., "Effect of size and roughness on light transmission in a $Si/SiO_2$ waveguide: Experiments and model," *Appl. Phys. Lett.* 77(11):1617-1619 (2000).

Lee, B.H. et al., "Effects of interfacial layer growth on the electrical characteristics of thin titanium oxide films on silicon," *Appl. Phys. Lett.* 74(21):3143-3145 (1999).

Mardare, D. and Rusu, G.I., "On the structure of Titanium Oxide Thin Films," *Analele Stiintifice Ale Universitatii IASI*, Romania, pp. 201-208 (1999).

Marques, P.V.S. et al., "Planar Silica-on-Silicon Waveguide Lasers Based in Two Layer Core Devices," 10th European Conference on Integrated Optics, Session WeB2, pp. 79-82 (2001).

Meijerink, A. et al, "Luminescence of $Ag^+$ in Crystalline and Glassy $SrB_4O_7$," *J. Physics Chem. Solids* 54(8):901-906 (1993).

Mesnaoui, M. et al, "Spectroscopic properties of $Ag^+$ ions in phosphate glasses of $NaPO_3$- $AgPO_3$ system," *Eur. J. Solid State Inorg. Chem.* 29:1001-1013 (1992).

Mizuno, Y. et al. "Temperature dependence of oxide decomposition on titanium surfaces in UHV," *J. Vac. Sci. & Tech. A* 20(5):1716-1721 (2002).

Ohkubo, H. et al., "Polarization-Insensitive Arrayed-Waveguide Grating Using Pure $SiO_2$ Cladding," Fifth Optoelectronics and Communication Conference (OECC 2000) Technical Digest, pp. 366-367 (2000).

Ohmi, S. et al., "Rare earth metal oxides for high-K gate insulator," VLSI Design 2004, 1 page (2004).

Ohtsuki, T. et al., "Gain Characteristics of a high concentration $Er^{3+}$-doped phosphate glass waveguide," *J. Appl. Phys.* 78(6):3617-3621 (1995).

Ono, H. et al., "Design of a Low-loss Y-branch Optical Waveguide," Fifth Optoelectronic and Communications Conference (OECC 2000) Technical Digest, pp. 502-503 (2000).

Padmini, P. et al. "Realization of High Tunability Barium Strontium Titanate Thin Films by rf Magnetron Sputtering," *Appl. Phys. Lett.* 75(20):3186-3188 (1999).

Pan, T. et al., "Planar $Er^{3+}$-doped aluminosilicate waveguide amplifier with more than 10 dB gain across C-band," Optical Society of America, 3 pages (2000).

Peters, D.P. et al., "Formation mechanism of silver nanocrystals made by ion irradiation of $Na^+ \leftrightarrow Ag^+$ion-exchanged sodalime silicate glass," *Nuclear Instruments and Methods in Physics Research B* 168:237-244 (2000).

Ramaswamy, R.V. et al., "Ion-Exchanged Glass Waveguides: A Review," *J. Lightwave Technology* 6(6):984-1002 (1988).

Roberts, S.W. et al., "The Photoluminescence of Erbium-doped Silicon Monoxide," University of Southampton, Department of Electronics and Computer Science Research Journal, 7 pages (1996).

Sanyo Vacuum Industries Co., Ltd. Products Info, $TiO_2$, (2003), 1 page http://www.sanyovac.co.jp/Englishweb/products/ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al. "PVD Coating of Plastic Webs and Sheets with High Rates on Large Areas," European Materials Research Society 1999 Spring Meeting, Jun. 1-4, 1999, Strasbourg, France, 13 pages (1999).

Second International Symposium of Polymer Surface Modification: Relevance to Adhesion, Preliminary Program, 13 pages (1999).

Seventh International Conference on $TiO_2$ Photocatalysis: Fundamentals & Applications, Toronto, Ontario, Canada, Final Program, 7 pages (Nov. 17-21, 2002).

Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).

Shin, J.C. et al. "Dielectric and Electrical Properties of Sputter Grown $(Ba,Sr)TiO_3$ Thin Films," *J. Appl. Phys.* 86(1):506-513 (1999).

Shmulovich, J. et al., "Recent progress in Erbium-doped waveguide amplifiers," Bell Laboratories, pp. 35-37 (1999).

Slooff, L.H. et al, "Optical properties of Erbium-doped organic polydentate cage complexes," *J. Appl. Phys.* 83(1):497-503 (1998).

Strohhofer, C. and Polman, A. "Energy transfer to $Er^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminium Foil," *Vuoto XXVIII*(1-2):51-54 (1999).

Tervonen, A., "Challenges and opportunities for integrated optics in optical networks," *SPIE* 3620:2-11 (1999).

Ting, C.Y. et al., "Study of planarized sputter-deposited $SiO_2$," *J. Vac. Sci. Technol*, 15(3):1105-1112 (1978).

Treichel, O. and Kirchhoff, V., "The influence of pulsed magnetron sputtering on topography and crystallinity of $TiO_2$ films on glass," *Surface and Coatings Technology* 123:268-272 (2000).

Tukamoto, H. and West, A.R., "Electronic Conductivity of $LiCoO^5$ and Its Enhancement by Magnesium Doping," *J. Electrochem. Soc.* 144(9):3164-3168 (1997).

Van Dover, R.B., "Amorphous Lanthanide-Doped $TiO_x$ Dielectric Films," *Appl. Phys. Lett.* 74(20):3041-3043 (1999).

Viljanen, J. and Leppihalme, M., "Planar Optical Coupling Elements for Multimode Fibers with Two-Step Ion Migration Process," *Applied Physics* 24(1):61-63 (1981).

Villegas, M.A. et al., "Optical spectroscopy of a soda lime glass exchanged with silver," *Phys. Chem. Glasses* 37(6):248-253 (1996).

Von Rottkay, K. et al., "Influence of stoichiometry on electrochromic cerium-titanium oxide compounds," Presented at the 11th Int'l Conference of Solid State Ionics, Honolulu, Hawaii, Nov. 19, 1997, Published in *Solid State Ionics* 113-115:425-430. (1998).

Westlinder, J. et al., "Simulation and Dielectric Characterization of Reactive dc Magnetron Cosputtered $(Ta_2O_5)_{1-x}(TiO_2)_x$ Thin Films," *J. Vac. Sci. Technol. B* 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yoshikawa, K. et al., "Spray formed aluminum alloys for sputtering targets," *Powder Metallurgy* 43(3):198-199 (2000).

Zhang, H. et al. "High Dielectric Strength, High k $TiO_2$ Films by Pulsed DC, Reactive Sputter Deposition," 5 pages (2001).

Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Response to Office Action filed on Oct. 17, 2005 in U.S. Appl. No. 10/291,179.
Final Office Action issued on Dec. 14, 2005 in U.S. Appl. No. 10/291,179.
Quayle Action issued Nov. 10, 2003, in U.S. Appl. No. 10/288,278.
Office Action issued Nov. 28, 2001, for US Patent No. 6,506,289.
Response to Office Action filed Feb. 20, 2002, for US Patent No. 6,506,289.
Office Action issued Apr. 17, 2002, for US Patent No. 6,506,289.
Response to Office Action filed Jul. 17, 2002, for US Patent No. 6,506,289.
PCT Invitation to Pay Additional Fees for PCT/US01/22750, dated Mar. 13, 2002.
PCT International Search Report for PCT/US01/22750, dated Jul. 19, 2002.
PCT Written Opinion for PCT/US01/22750, dated Jul. 23, 2002.
PCT International Preliminary Examination Report for PCT/US01/22750, dated Oct. 8, 2002.
Office Action issued on May 2, 2002 in U.S. Patent No. 6,533,907.
Response to Office Action filed on Sep. 3, 2002 in U.S. Patent No. 6,533,907.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Mar. 10, 2005 in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on Nov. 28, 2005 in U.S. Appl. No. 09/903,081.
Response to Office Action filed Feb. 28, 2006 in U.S. Appl. No. 09/903,081.

Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, in U.S. Appl. No. 10/101,863.
Response to Office Action filed on Jun. 10, 2005 in U.S. Appl. No. 10/101,863.
Office Action issued on Aug. 4, 2005, in U.S. Appl. No. 10/101,863.
Response to Office Action filed Dec. 5, 2005, in U.S. Appl. No. 10/101,863.
Final Office Action issued on Feb. 14, 2006, in U.S. Appl. No. 10/101,863.
Response to Office Action filed Feb. 24, 2006, in U.S. Appl. No. 10/101,863.
Office Action dated Mar. 25, 2005, received in U.S. Appl. No. 10/954,182.
Response to Office Action filed on Jul. 25, 2005 in U.S. Appl. No. 10/954,182.
Office Action issued on Oct. 25, 2005, in U.S. Appl. No. 10/954,182.
Response to Office Action filed on Dec. 21, 2005 in U.S. Appl. No. 10/954,182.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on Aug. 8, 2005 in U.S. Appl. No. 10/101,341.
Response to Office Action filed on Nov. 8, 2005, in U.S. Appl. No. 10/101,341.
Office Action issued on Feb. 13, 2006, in U.S. Appl. No. 10/101,341.
Office Action issued on May 4, 2004 in U.S. Appl. No. 10/101,493.
Office Action issued on Oct. 3, 2005 in U.S. Appl. No. 10/650,461.
Response to Office Action filed on Jan. 3, 2006 in U.S. Appl. No. 10/650,461.
International Search Report mailed on Dec. 12, 2003 in PCT/US03/24809.
International Preliminary Examination Report mailed on Apr. 15, 2004 in PCT/US03/24809.
Office Action issued on Dec. 2, 2005 in U.S. Appl. No. 10/789,953.
Response to Office Action filed Mar. 2, 2006 in U.S. Appl. No. 10/789,953.
Specification and Preliminary Amendment as filed for U.S. Appl. No. 11/297,057.
International Search Report issued on Oct. 25, 2004 in PCT/US2004/005531.
Written Opinion issued on Oct. 25, 2004 in PCT/US2004/005531.
Office Action issued on Mar. 24, 2005 in U.S. Appl. No. 10/851,542.
Response to Office Action dated Jul. 25, 2005 in U.S. Appl. No. 10/851,542.
Office Action issued on Oct. 19, 2005 in U.S. Appl. No. 10/851,542.
Response to Office Action filed Jan. 19, 2006 in U.S. Appl. No. 10/851,542.
PCT International Search Report and Written Opinion for Application No. PCT/US2004/014524 dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Specification as filed for U.S. Appl. No. 11/297,057.
Amendment dated Oct. 19, 2006, in U.S. Appl. No. 09/903,081.
Final Office Action mailed Oct. 19, 2006, in U.S. Appl. No. 10/650,46.

Agrawal, G.P., in: Fiber-Optic Communication Systems, 2nd Edition, John Wiley & Sons, New York, pp. 361-399 and 415 (1997).
Cocorullo, G. et al., "Amorphous silicon waveguides and light modulators for integrated photonics realized by low-temperature plasma-enhanced chemical-vapor deposition," Optics Lett. 21(24):2002-2004 (1996).
Masuda, H. & Kawai, S., "Wide-band and gain-flattened hybrid fiber amplifier consisting of an EDFA and a multiwavelength pumped raman amplifier," IEEE Photonics Technology Lett. 11(6):647-649 (1999).
Snoeks, E. et al., "Cooperative upconversion in erbium-implanted soda-lime silicate glass optical waveguides," J. Opt. Soc. Am. B 12(8):1468-1474 (1995).
Response to Office Action filed Jul. 27, 2006, in U.S. Appl. No. 10/291,179.
Notice of Allowance mailed Aug. 6, 2002, for US Patent No. 6,506,289.
Notice of Allowance mailed Mar. 25, 2004 for US Patent No. 6,827,826.
Notice of Allowance issued on Oct. 8, 2002, in U.S. Patent No. 6,533,907.
Notice of Allowance issued on Oct. 21, 2004, in U.S. Appl. No. 10/101,492.
Response to Office Action filed Jun. 12, 2006, in U.S. Appl. No. 10/101,863.
Office Action mailed Sep. 6, 2006, in U.S. Appl. No. 10/101,863.
Response to Office Action filed on Aug. 9, 2006 in U.S. Appl. No. 10/954,182.
Office Action issued on Aug. 2, 2006, in U.S. Appl. No. 10/101,341.
Office Action issued on Mar. 23, 2006, in U.S. Appl. No. 10/650,461.
Response to Office Action filed on Jul. 24, 2006, in U.S. Appl. No. 10/650,461.
Voluntary Amendment filed Jul. 26, 2006 in TW Appl. No. 92123625.
Response to Office Action from Singapore Patent Office in Appl. No. 200505388-9, dated Aug. 11, 2006.
Response to Office Action filed Jul. 26, 2006 in U.S. Appl. No. 10/851,542.
Voluntary Amendment filed Aug. 15, 2006 in TW Appl. No. 94143175.
Specification as filed Sep. 2, 2005, for U.S. Appl. No. 11/218,652.
Office Action dated Dec. 18, 2006, in U.S. Appl. No. 09/903,081.
Response to Office Action dated Feb. 6, 2007, in U.S. Appl. No. 10/101,863.
Office Action dated Oct. 31, 2006, in U.S. Appl. No. 10/954,182.
Response to Office Action dated Dec. 6, 2006, in U.S. Appl. No. 10/954,182.
Supplemental Preliminary Amendment dated Feb. 6, 2007, in U.S. Appl. No. 11/228,834.
Supplemental Preliminary Amendment dated Feb. 6, 2007, in U.S. Appl. No. 11/191,643.
Response to Office Action dated Dec. 5, 2007, in U.S. Appl. No. 09/903,081.
Final Office Action dated Jan. 29, 2008, in U.S. Appl. No. 09/903,081.
Office Action dated Apr. 28, 2008, in U.S. Appl. No. 11/100,864.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Amendment/RCE filed Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Preliminary Amendment dated Mar. 11, 2008, in U.S. Appl. No. 11/228,717.
Notice of Allowance dated Apr. 2, 2008, in U.S. Appl. No. 11/228,717.
Office Action dated Nov. 16, 2007, in U.S. Appl. No. 10/650,461.
Response to Office Action filed Apr. 16, 2008, in U.S. Appl. No. 10/650,461.

Response to Office Action filed Mar. 19, 2007, in U.S. Appl. No. 09/903,081.
Final Office Action dated Apr. 13, 2007, in U.S. Appl. No. 09/903,081.
Amendment/RCE filed Aug. 9, 2007, in U.S. Appl. No. 09/903,081.
Office Action dated Sep. 5, 2007, in U.S. Appl. No. 09/903,081.
Final Office Action dated May 2, 2007, in U.S. Appl. No. 10/101,863.
Response to Final Office Action filed Oct. 2, 2007, in U.S. Appl. No. 10/101,863.
Response to Office Action filed Mar. 30, 2007, in U.S. Appl. No. 10/954,182.
Notice of Non-Compliant Amendment dated Apr. 12, 2007, in U.S. Appl. No. 10/954,182.
Response to Notice of Non-Compliant Amendment filed Apr. 23, 2007, in U.S. Appl. No. 10/954,182.
Final Office Action dated Jul. 24, 2007, in U.S. Appl. No. 10/954,182.
Preliminary Amendment filed Sep. 16, 2005, in U.S. Appl. No. 11/228,834.
Preliminary Amendment filed Jul. 27, 2005, in U.S. Appl. No. 11/191,643.
Corrected Preliminary Amendment filed Sep. 19, 2005, in U.S. Appl. No. 11/191,643.
Amendment/RCE filed Oct. 31, 2007, in U.S. Appl. No. 10/650,461.
Response to Office Action filed Feb. 20, 2007, in U.S. Appl. No. 10/650,461.
Office Action dated Mar. 6, 2007, in U.S. Appl. No. 10/650,461.
Response to Office Action filed Jul. 9, 2007, in U.S. Appl. No. 10/650,461.
Final Office Action dated Oct. 10, 2007, in U.S. Appl. No. 10/650,461.
Notice of Appeal filed Apr. 25, 2008, in U.S. Appl. No. 09/903,081.
Appeal Brief filed Jun. 30, 2008, in U.S. Appl. No. 09/903,081.
Notice of Allowance mailed Aug. 22, 2008, in U.S. Appl. No. 09/903,081.
Office Action dated May 29, 2008, in U.S. Appl. No. 11/228,834.
Response to Office Action filed Sep. 29, 2008, in U.S. Appl. No. 11/228,834.
Notice of Allowance dated Dec. 30, 2008, in U.S. Appl. No. 11/228,834.
Supplemental Notice of Allowance dated Apr. 23, 2009, in U.S. Appl. No. 11/228,834.
Office Action dated Mar. 30, 2009, in U.S. Appl. No. 11/191,643.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Office Action dated Oct. 28, 2008, in U.S. Appl. No. 10/650,461.
Response to Office Action filed Apr. 28, 2009, in U.S. Appl. No. 10/650,461.
Final Office Action mailed Aug. 19, 2009, in U.S. Appl. No. 10/650,461.
Amendment in Response to Office Action filed Nov. 19, 2009, in U.S. Appl. No. 10/650,461.
Notice of Allowance mailed Dec. 31, 2009, in U.S. Appl. No. 10/650,461.
Corrected Notice of Allowance mailed Mar. 3, 2010, in U.S. Appl. No. 10/650,461.
Supplemental Notice of Allowance dated Jul. 17, 2008, in U.S. Appl. No. 11/228,717.
Final Office Action dated Apr. 27, 2010, in U.S. Appl. No. 11/191,643.
Amendment with RCE filed Jul. 26, 2010, in U.S. Appl. No. 11/191,643.
Office Action mailed Feb. 16, 2011, in U.S. Appl. No. 11/191,643.
Response to Office Action filed May 16, 2011, in U.S. Appl. No. 11/191,643.
Notice of Allowance mailed Jun. 24, 2010, in U.S. Appl. No. 10/650,461.
Kelly, P.J. et al., "A novel technique for the deposition of aluminum-doped zinc oxide films," *Thin Solid Films* 426(1-2):111-116 (2003).
Tomaszewski, H. et al., "Yttria-stabilized zirconia thin films grown by reactive r.f. magnetron sputtering," *Thin Solid Films* 287:104-109 (1996).
Response to Final Office Action mailed Apr. 14, 2006, in U.S. Appl. No. 10/291,179.
Office Action mailed Apr. 27, 2006, in U.S. Appl. No. 10/291,179.
Notice of Allowance mailed Nov. 10, 2003 for US Patent No. 6,506,289.
Final Office Action mailed May 8, 2006 in U.S. Appl. No. 09/903,081.
Office Action mailed Mar. 22, 2006, in U.S. Appl. No. 10/101,863.
Office Action issued on Mar. 9, 2006, in U.S. Appl. No. 10/954,182.
Response to Office Action filed on May 15, 2006, in U.S. Appl. No. 10/101,341.
Final Office Action issued on May 19, 2006 in U.S. Appl. No. 10/789,953.
Office Action from Singapore Patent Office in Appl. No. 200505388-9, dated Mar. 20, 2006.
Office Action mailed Apr. 19, 2006 in U.S. Appl. No. 10/851,542.

\* cited by examiner

SIDEWALL ROUGHNESS INDUCED SCATTERING LOSS IN BCWs

| Index Contrast | Field Mode Diameter | Half Width | Roughness (μm) | Roughness /half width | Loss dB/cm | Roughness (μm) | Roughness /half width | Loss dB/cm |
|---|---|---|---|---|---|---|---|---|
| 0.20% | 11.00 | 4.4 | 0.001 | 0.02% | 5.17E-06 | 0.002 | 0.05% | 2.07E-05 |
| 0.40% | 8.00 | 3 | 0.001 | 0.03% | 1.63E-05 | 0.002 | 0.07% | 6.52E-05 |
| 0.50% | 7.50 | 2 | 0.001 | 0.05% | 5.50E-05 | 0.002 | 0.10% | 2.20E-04 |
| 1% | 5.50 | 1.5 | 0.001 | 0.07% | 1.30E-04 | 0.002 | 0.13% | 5.21E-04 |
| 2% | 4.00 | 0.9 | 0.001 | 0.11% | 6.04E-04 | 0.002 | 0.22% | 2.41E-03 |
| 4% | 3.00 | 0.65 | 0.001 | 0.15% | 1.60E-03 | 0.002 | 0.31% | 6.41E-03 |
| 6% | 2.40 | 0.5 | 0.001 | 0.20% | 3.52E-03 | 0.002 | 0.40% | 1.41E-02 |
| 0.20% | 11.00 | 4.4 | 0.004 | 0.09% | 8.26E-05 | 0.008 | 0.18% | 3.31E-04 |
| 0.40% | 8.00 | 3 | 0.004 | 0.13% | 2.61E-04 | 0.008 | 0.27% | 1.04E-03 |
| 0.50% | 7.50 | 2 | 0.004 | 0.20% | 8.80E-04 | 0.008 | 0.40% | 3.52E-03 |
| 1% | 5.50 | 1.5 | 0.004 | 0.27% | 2.09E-03 | 0.008 | 0.53% | 8.34E-03 |
| 2% | 4.00 | 0.9 | 0.004 | 0.44% | 9.66E-03 | 0.008 | 0.89% | 3.86E-02 |
| 4% | 3.00 | 0.65 | 0.004 | 0.62% | 2.56E-02 | 0.008 | 1.23% | 1.03E-01 |
| 6% | 2.40 | 0.5 | 0.004 | 0.80% | 5.63E-02 | 0.008 | 1.60% | 2.25E-01 |
| 0.20% | 11.00 | 4.4 | 0.016 | 0.36% | 1.32E-03 | 0.032 | 0.73% | 5.29E-03 |
| 0.40% | 8.00 | 3 | 0.016 | 0.53% | 4.07E-03 | 0.032 | 1.07% | 1.67E-02 |
| 0.50% | 7.50 | 2 | 0.016 | 0.80% | 1.41E-02 | 0.032 | 1.60% | 5.63E-02 |
| 1% | 5.50 | 1.5 | 0.016 | 1.07% | 3.34E-02 | 0.032 | 2.13% | 1.33E-01 |
| 2% | 4.00 | 0.9 | 0.016 | 1.78% | 1.55E-01 | 0.032 | 3.56% | 6.18E-01 |
| 4% | 3.00 | 0.65 | 0.016 | 2.46% | 4.10E-01 | 0.032 | 4.92% | 1.64E+00 |
| 6% | 2.40 | 0.5 | 0.016 | 3.20% | 9.01E-01 | 0.0v | 6.40% | 3.60E+00 |
| 0.20% | 11.00 | 4.4 | 0.064 | 1.45% | 2.12E-02 | 0.128 | 2.91% | 8.46E-02 |
| 0.40% | 8.00 | 3 | 0.064 | 2.13% | 6.67E-02 | 0.128 | 4.27% | 2.67E-01 |
| 0.50% | 7.50 | 2 | 0.064 | 3.20% | 2.25E-01 | 0.128 | 6.40% | 9.01E-01 |
| 1% | 5.50 | 1.5 | 0.064 | 4.27% | 5.34E-01 | 0.128 | 8.53% | 2.14E+00 |
| 2% | 4.00 | 0.9 | 0.064 | 7.11% | 2.47E+00 | 0.128 | 14.22% | 9.89E+00 |
| 4% | 3.00 | 0.65 | 0.064 | 9.85% | 6.56E+00 | 0.128 | 19.69% | 2.63E+01 |
| 6% | 2.40 | 0.5 | 0.064 | 12.80% | 1.44E+01 | 0.128 | 25.60% | 5.77E+01 |
| 0.20% | 11.00 | 4.4 | 0.256 | 5.82% | 3.39E-01 | | | |
| 0.40% | 8.00 | 3 | 0.256 | 8.53% | 1.07E+00 | | | |
| 0.50% | 7.50 | 2 | 0.256 | 12.80% | 3.60E+00 | | | |
| 1% | 5.50 | 1.5 | 0.256 | 17.07% | 8.54E+00 | | | |
| 2% | 4.00 | 0.9 | 0.256 | 28.44% | 3.96E+01 | | | |
| 4% | 3.00 | 0.65 | 0.256 | 39.38% | 1.05E+02 | | | |
| 6% | 2.40 | 0.5 | 0.256 | 51.20% | 2.31E+02 | | | |

FIG. 1

MODE SIZE CONVERTER FOR A PLANAR WAVEGUIDE

This is a division of application Ser. No. 10/101,492, filed Mar. 16, 2002 now U.S. Pat. No. 6,884,327, now published as US 2003-0173208 A1, which is incorporated herein by reference.

BACKGROUND

1. Field of the Invention

The present invention relates to optical coupling into a planar waveguide and, in particular, to a mode size converter for coupling light into and out of a planar waveguide and to efficiently transform guided light within continuous waveguide structures.

2. Discussion of Related Art

The increasing prevalence of fiber optic communications systems has created an unprecedented demand for devices for processing optical signals. Planar devices such as optical waveguides, couplers, splitters, and amplifiers, fabricated on planar substrates, like those commonly used for integrated circuits, and configured to receive and process signals from optical fibers are highly desirable. Such devices hold promise for integrated optical and electronic signal processing on a single semiconductor-like substance.

The basic design of planar optical waveguides and amplifiers is well known, as described, for example, in U.S. Pat. Nos. 5,119,460 and 5,563,979 to Bruce et al., 5,613,995 to Bhandarkar et al., 5,900,057 to Buchal et al., and 5,107,538 to Benton et al., to cite only a few. These devices, very generally, include a core region, typically bar shaped, of a certain refractive index surrounded by a cladding region of a lower refractive index. In the case of an optical amplifier, the core region includes a certain concentration of a dopant, typically a rare earth ion such as an erbium or praseodymium ion which, when pumped by a laser, fluoresces, for example, in the 1550 nm and 1300 nm wavelength ranges used for optical communication, to amplify the optical signal passing through the core.

Many designs have been disclosed for the purpose of mode size or spot size conversion in planar optical wave guide devices. In general, a change in the core of the wave guide, either to it's index or to it's cross sectional dimensions, over a suitably long distance is utilized to effect a change in the mode size or mode order of the guided light wave. The requirement for gradual change in the properties that govern the mode size is well understood with regard to efficient or 'adiabatic' transformation, which results in loss-less conversion of the guided light to a mode having transformed properties such as size, order, shape or propagation constant.

In practice however, it is difficult to change the dimensions of a planar wave guide without loss due to roughness or to non-uniform changes in the wave guide. In particular, sufficiently slowly varying dimensions with a sufficiently smooth surface, so that the light is efficiently converted in its modal properties, without scattering or loss due to roughness or to non-uniform changes in the dimensions or index of the wave guide is very hard to achieve, particularly for high contrast or refractory wave guide materials.

In-plane (i.e., in the plane of the substrate) as well as out-of-plane (i.e., perpendicular to the plane of the substrate) tapers can be achieved by lithographic and etching means. However, it is difficult to achieve sufficiently uniform results for a portion of a film or wave guide tapered over a few mm to a few cm regions across, for instance, a production silicon wafer having dimensions of 100 to 300 mm.

Therefore, there is a need for tapered waveguides with low surface roughness in order to provide mode size conversion with low coupling loss.

SUMMARY

In accordance with the present invention, a smooth waveguide taper is presented. A smooth waveguide taper can be produced as an out-of-plane taper during deposition of the film by a shadow-mask deposition. A shadow mask is placed over the substrate in a PVD reactor during deposition. The resulting taper can be monotonically variable in thickness as well as atomic like in smoothness.

Further, in some embodiments the length of the taper can be controlled by controlling the shadow mask shape and the separation between the shadow mask and the wafer. In some embodiments, a long taper may be produced. In some embodiments, a short taper of order less than a millimeter can be produced.

Several mode size coupling devices can be fabricated according to the present invention. In some embodiments, a tapered core material is deposited on an under cladding layer which was deposited on a substrate. The tapered core material can then be patterned to form a waveguide core and an upper-cladding layer can be formed over the waveguide core. The tapered waveguide core can be an active or a passive waveguide material. In some embodiments, another core material can be deposited between the tapered waveguide core and the substrate. In some embodiments, another core material can be deposited over the tapered waveguide core.

In some embodiments, a first core layer can be deposited and then a tapered core layer deposited having the same material properties as the first core layer. In some embodiments, a tapered active core layer can be deposited with a passive layer overlying it, or a passive layer surrounding it, or a passive layer deposited under it.

These and other embodiments are further discussed below with respect to the following figures.

BRIEF DESCRIPTION OF THE FIGURES

FIG. 1 shows a table of projected surface roughness induced loss associated with a range of roughness for the contrast and core size typical of a step contrast single mode erbium doped buried ridge wave guide amplifier (EDWA).

Figure 2:
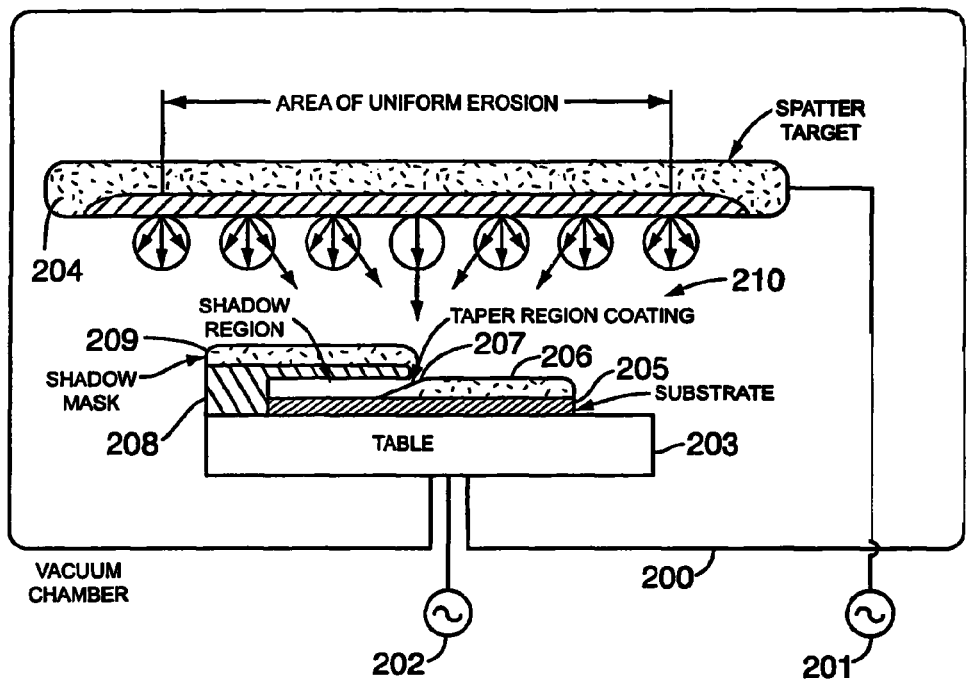
FIG. 2 shows deposition of material on a substrate to form a taper according to the present invention.

In the figures, elements having the same designation have the same or similar functions.

DETAILED DESCRIPTION

RF sputtering of oxide films is discussed in application Ser. No. 09/903,050 (the '050 application) by Demaray et al., entitled "Planar Optical Devices and Methods for Their Manufacture," assigned to the same assignee as is the present invention, herein incorporated by reference in its entirety. Depositions by biased pulse-DC sputtering are described in U.S. application Ser. No. 10/101,863 (the '863 application), herein incorporated by reference in its entirety. Further, targets that can be utilized in a reactor according to the present invention are discussed in U.S. application Ser. No. 10/101,341 (the '341 application), filed on Mar. 16, 2002, assigned to the same assignee as is the present invention, herein incorporated by reference in its entirety. A gain-flattened amplifier formed of films deposited according to the present invention are described in U.S. application Ser. No. 10/101,493 (the '493 application), filed on Mar. 16, 2002, assigned to the same assignee as is the present invention, herein incorporated by reference in its entirety.

Three features of etched tapers limit the production of low loss wave guides with mode size transforming regions: sidewall and surface roughness, the terminal radius of the taper and most important, the relative fluctuation of the core dimension due to roughness for small core dimensions.

As an etched or polished film approaches the termination of the taper or etch, it is difficult to complete the taper without a terminal radius of curvature or a terminal roughness. This is due as much to initial film roughness and initial thickness non uniformity as it is to the non uniformities in the etch mask process printing and material and the porosity and etch selectivity of the composition of the film material. A film with 5% thickness variation, for example, can not be etched to the final 5% of the initial film thickness without becoming a discontinuous film, at least in parts. Although the 5% initial variation in a 5 micron film, some 250 nm variation, might vary smoothly and not be a problem as a feature of a patterned, constant dimension core of a buried channel waveguide (BCW), the same variation, either as a periodic structure or a terminal radius of an etched film can act as a scattering center, introducing unwanted loss or polarization to the guided light.

In the case of a ridge wave guide, the scattering loss induced by the roughness of the sides or top of the ridge is increased by the high index contrast of the ridge to air. In the case of buried channel wave guides, BCWs, the cladding reduces the contrast to the core found in the air cladded ridge wave guide. Reduced contrast reduces the side wall scattering loss for wide width BCWs. However, as the contrast of the BCW increases, the scattering loss due to roughness is increased rapidly in at least two ways: First, scattering is increased in proportion to the contrast of the buried core with the cladding index; and Second, it is increased by the decrease in the size of the core that is required for single mode propagation at any wavelength with higher contrast.

The second effect illustrates the more important consideration. The scattering loss is proportional to the square of the ratio of the roughness dimension over the half width of the BCW core. This is known as the "relative fluctuation of the core thickness". See FRANCOIS LADOUCCEUR, JOHN D. LOVE, SILICA-BASED BURIED CHANNEL WAVEGUIDES AND DEVICES, p. 98 (Chapman & Hall, 1996).

Consequently, as the wave guide width is decreased, the scattering due to side wall roughness increases rapidly. As an example, a low refractive index contrast step BCW with a half width of 4.44 microns and a 0.2% contrast must have a relative fluctuation of the core thickness of less than 1% to achieve a loss not greater than 0.01 dB/cm for light of 1.3 microns. Id.

The scattering of c-band light near 1550 nm would be similar to that for 1.3 micron light. FIG. 1 shows a table of the roughness induced loss associated with a range of roughness for the contrast and core size typical of a single mode BCW. As the refractive index contrast goes up, the pump light becomes more concentrated in the core of the amplifier. As illustrated in FIG. 1, the mode field diameter decreases as the core half width decreases, demonstrating the dramatic concentration of the propagating light with increasing contrast and decreasing core size.

For the same range of BCD index contrast, mode field diameter and core half width, the relative fluctuation of the core thickness and the loss in dB/cm are correlated for a range of roughness dimension from 0.001 to 0.256 microns (1 to 256 nm) in steps of 2×. FIG. 1 illustrates that the loss increases with surface roughness.

The core half widths (half the size of the core width) chosen in FIG. 1 are the largest values for which light at 980 nm, having the indicated mode field diameter, will be single mode at the tabulated index contrast. The loss that is correlated with the respective roughness is an estimate for the loss in the range between 1.3 nm and 1.5 nm. This loss is representative of the scattering loss of a c band signal (i.e., a signal in the range 1528 to 1562 nm) co-propagating in the same wave guide with 980 nm pump light.

The gain of a doped BCW amplifier is proportional to the number of dopant ions, for instance erbium ions, in the excited state. The fraction of excited active ions is proportional to the intensity of the light. Consequently, it is of great utility to provide an adiabatic mode size transition from a small contrast, large mode wave guide, suitable for low loss coupling to fiber, to a high contrast, small mode wave guide. The mode field diameter in the range of between about 0.2% to 0.4% is similar to that of an SMF-28 fiber. Consequently a wave guide with this mode size will couple efficiently to light propagating from the fiber.

As shown in the table of FIG. 1, such a wave guide can have a side wall roughness between about 0.032 and about 0.064 microns for a loss of about 0.01 dB/cm. This is attainable for silica based materials by dry etching processes. However, this represents the lower limit of as etched sidewall roughness that can be achieved by lithography and dry etch for an eight to nine micron high etched sidewall.

If the light in such a large passive wave guide were coupled efficiently by a mode size conversion device into a high contrast wave guide, the intensity of the pump light could be increased very substantially. AS shown in table 1, in the case of the 6% contrast wave guide, the mode field diameter is 2.4 microns. The increase in optical intensity of the pump light is proportional to the square of the ratio of the respective mode field diameters which is approximately $\sim(10/2.4)^2\sim17$.

FIG. 1 clearly shows that the roughness required for a 6% contrast, 1 micron width wave guide is about 2 nm for the scattering loss to be less than about 0.01° dB/cm. Although the tabulated data shown in FIG. 1 is an approximation, it is clear for higher index wave guides, tenths of nanometer or Angstrom roughness is required for low loss wave guide structures. In the case of refractory oxide based wave guides such as pure silica or alumina or alloys of these and others, the roughness of 1 micron high etched sidewall is difficult to reduce below about 0.032 microns. FIG. 1 shows that the loss due to such a roughness is more than 3 dB/cm which is equivalent to the gain per centimeter of the very best erbium doped wave guide amplifiers, EDWAs.

It is also clear that the roughness that governs the loss in a BCW is due to the mode limiting dimension of the core. That is, if the width is tapered to a smaller value, it is the roughness associated with the side wall roughness associated with the relative variation in the width that determines the scattering loss. Likewise, if the thickness of the BCW is varied so as to limit the mode field of the guided light, it is the relative variation of the roughness associated with the thickness that is most important in governing the loss of the resulting BCW.

Many processes have been developed to provide tapered planar wave guide structures for the purpose of spot size or mode size conversion. Some of these utilize an etch step in at least one dimension of the core or cladding or both. In the case of polymer or other low temperature glassy material which can be re-flowed or smoothed by partial melting, subject to surface tension, post etch improvement in the surface quality can be achieved. Dry etching of low contrast wide core BCWs can achieve this result. However, it is not possible for higher contrast, smaller dimension BCWs to be produced by these methods because the roughness induced increases rapidly as the contrast increases and the core size decreases. This is particularly true in refractory materials that can not be raised to the melting point.

Although the in-plane dimension or width of a core wave guide structure is easily modified by lithographic means, either by directly patterning a deposited film and etching or by filling an etched trench, the required degree of change in width over the necessary distance, it is very difficult to achieve a sufficiently smooth etched ridge sidewall to avoid high scattering, losses for a narrow, high contrast core. U.S. Pat. No. 5,563,979 to Bruce, et. al. discusses tapering of the core of a light wave guiding structure having a high index contrast of 11%. Bruce et al. suggest that the taper needs to be gradual, at least a hundred times the cross sectional dimension of the core which is on the order of a micron thick. They also suggest that the means of achieving such a taper in both the width and the thickness of an aluminosilicate are known.

However, in high temperature material, such as pure silica, or alumina or other refractory oxide material, it is difficult to achieve a side wall roughness less than 50-100 nano meters using reactive or other dry plasma etch processes.

Taper of the thickness of a deposited film or core is more difficult. Although tapering can be achieved by etching using a gray scale mask techniques or a shadow mask. See, e.g., M. Itoh, et. al., "Large Reduction of Single Fiber Coupling Loss in 1.5% Delta Planar Lightwave Circuits using Spot-size Converters", Electronic Letters 17 Jan. 2002 Vol. 38 No. 2. Uniform etching of a film of tenths of microns to several microns over hundreds of microns of length is, however, very difficult. In particular the roughness of the surface of the core having the highest intensity of guided light is the most important. Re-melting can be used to smooth low temperature materials but not for materials that can not be raised to their melting point, for example erbium doped aluminasilicates.

In the case of the BCW, the thickness dimension is often the smallest or mode limiting dimension. In this case, the roughness of the lateral edges is of less importance since the mode size is confined proportionally more by the thickness dimension. However, dry etching of a surface is prone to roughness due to build up of non volatile components of the film as well as differential erosion due to density variation or differential etch selectivity of the component elements of the film. Moreover, the use of an etch shadow mask is limited to a range of taper lengths due to the limited mean free path of the etching process. The mean free path in a gas is a measure of the average distance between collisions of the gas. It is also a measure of the line of sight distance a shaddow can be projected in a gas. It is also a measure of the distance over which a directionality can be preserved in a gaseous flux without the randomization effect of the background scattering gas. Typical dry etch processes are performed at a process pressure of several Torr. At one Torr the mean free path or average distance traveled in the vacuum by a gas atom at room temperature without a collision is about 0.1 mm or 100 microns. This distance complies with the (100× core width) taper length requirement for the adiabatic taper of a 1 micron dimension. See LADOUCCEUR et al. Because some portion of a shaddow persists for several mean free path lengths, this can be extended for reduction of thickness by masked etching to several microns. However, for higher contrast wave guides or for transformation between wave guides of larger core differences, a taper length of several millimeters to a centimeter may be necessary. A 1 cm mean free path requires an etch pressure less than 10 mTorr. Reactive etch rates, however, are impractically slow or a reactor can not be induced to sustain plasma at this process pressure.

FIG. 2 illustrates fabrication of a taper according to the present invention. Substrate 205 is positioned opposite a target 204 in a PVD deposition chamber 200. Power can be applied to target 204 from power supply 201 such as is described in the '863 application and in the '050 application. In some embodiments, bias power can be applied to substrate 205 from bias power supply 202. Sputtering gasses can be introduced to PVD chamber 200. PVD chamber 200 can be an RF sputtering chamber such as that described in the '050 application or a biased pulsed-DC sputtering chamber such as that described in the '863 application.

A shadow mask 209 is positioned Over substrate 205. In some embodiments, mask 209 may be fitted over a wafer substrate 205. In some embodiments, mask 209 may be positioned on substrate 205 or be a structure previously formed on substrate 205. Core film 206 is then deposited, but with shadow mask 209 in place a smooth taper 207 is formed.

In the deposition process illustrated in FIG. 2, the deposited film thickness decrease of taper 207 can be achieved in a gradual, adiabatic taper rate over a distance of millimeters to several centimeters with high lateral taper uniformity. At the same time the surface, roughness of the tapered film can be as good as about 0.2 nm or 2 Angstroms average roughness, providing an optical quality, low loss surface suitable for efficient mode transformation of high or low contrast structures and devices with very low scattering loss.

FIG. 2 shows a side view of shadow mask 209 in PVD deposition chamber 200. Shadow mask 209 is positioned above substrate 205 and adjacent to a region of substrate 205 which is to be coated with a core film 206. Tapered portion 207 of layer 206 will result by the line of sight shadow provided by mask 209. The vapor distribution from the sputter source of target 204 is cosine like. That is, the intensity of the angular distribution of the atoms from target 204 goes to zero as the angle of departure of the sputtered atom from the surface of target 204 goes to zero. Sputtered vapor impinges on mask 209 and the region below mask 209 is substantially free of film. The region away from mask 209 receives a flux of vapor from all directions, substantially independent of mask 209. Vapor arriving at a surface of mask 209 is collected on mask 209. An upper surface of mask 209 will project a shadow of collected material that will not arrive at the surface of substrate 205, forming a tapered region 207 in layer 206 far from mask 209. If the out of plane edge of mask 209 is a straight edge, and the distribution of incoming vapor is uniform, the taper of layer 206 will have a gradient that is perpendicular to the mask edge.

Figure 3:
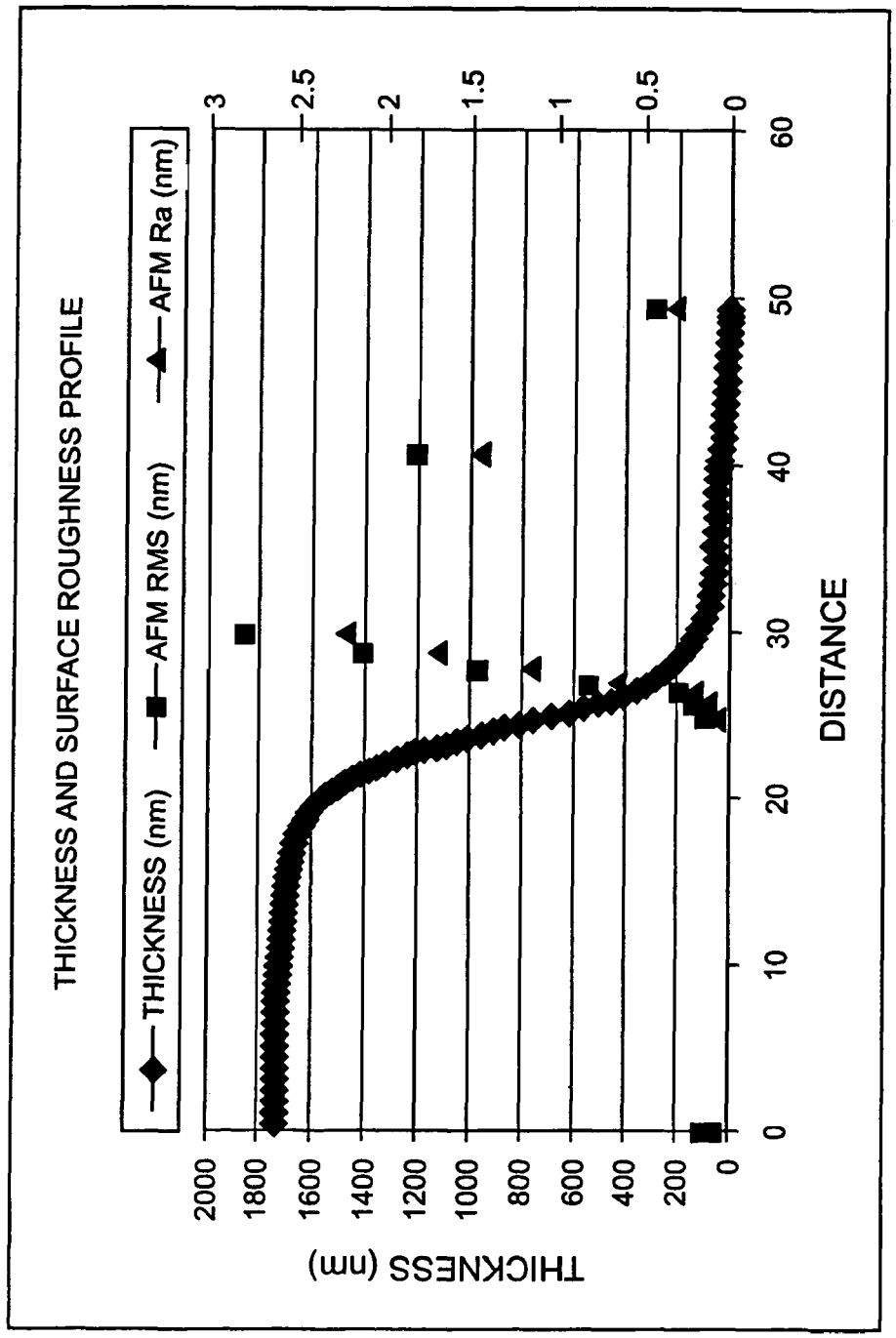
FIG. 3 shows thickness versus distance along a taper formed according to the present invention.

FIG. 3 shows the thickness profile for a deposition of about 1.8 microns thick, 0.8% Er/0.8% Yb doped (50/50) % aluminosilicate by PVD deposition using a reactive pulsed DC PVD process as described in the '245 application. The mask was formed with a 100 mm square open region in a full coverage quartz disk that supported itself all around on table 203, overlaying a 150 mm silicon wafer substrate 205 as shown in FIG. 2. The resulting upper portion of shadow mask 209 was approximately 0.5 mm thick, the underside was supported about 0.5 mm from the top surface of substrate 205. The resulting film thickness taper 207 and surface roughness as measured by atomic force microscopy (AFM) is shown in FIG. 3 as a function of distance in mm.

The edge of the cutout of shaddow mask 204 was positioned approximately at the 25 mm position, above the position of film taper 207 at approximately half the full thickness of the film. Layer 206 was deposited at a pulsed DC sputtering power of about 5 kWatts, at a rate of about 500 nm/hour, with substrate radio frequency power bias of about 300 Watts at 2 MHz. The film has an index contrast of about 4% to thermal oxide, as has been described in the '245 application.

The first and last 10% of the film taper of taper region 207 occurs over about 20 mm each. The remaining 80% of the taper in taper region 207 occurs over about 10 mm or 10,000 microns. Consequently, over the steep portion of the film taper, the rate of taper in this example is about 1.400 microns/10,000 microns or 0.14 parts per thousand. Other embodiments will result in other geometries of taper region 207. The surface roughness of the Er/Yb doped aluminosilicate film 206 of this example at the full thickness region was about 0.2 nm. A similar surface roughness was found at the half height region of the film taper 207 for this example. FIG. 3 shows the maximum as-deposited roughness to be less than about 3 nm, which occurred in a region under shadow mask 209. This roughness was interpreted as being due to weakly adherent film material which was subsequently removed from the surface of layer 206 by a cleaning processes to provide a surface roughness not greater than about 1 nm in this example.

Figure 4:
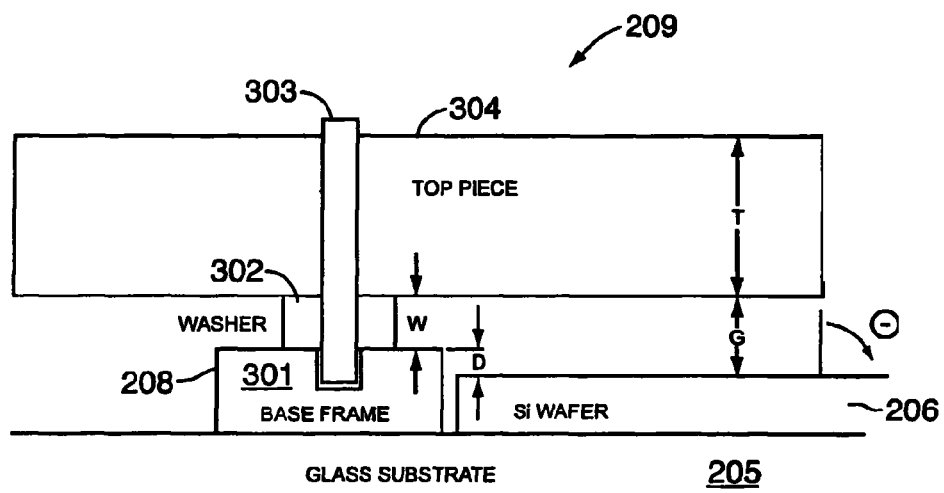
FIG. 4 shows an embodiment of a shadow mask that can be utilized to form a taper according to the present invention.

If the mask is supported at a distance from the surface to be coated, some portion of the vapor will be deposited under the mask, forming a continuous portion of the film taper. FIG. 4 shows another embodiment of shadow mask 209 that was formed of quartz parts having a top piece 304 with a thickness T supported by a washer or spacer 302 with a thickness W on a base frame which was thicker by an amount D (e.g., about 0.3 nm) than substrate 205. The bottom of shadow mask 209, then, is supported a distance G=W+D.

The taper 207 can be a positive or negative taper in the thickness of layer 206. The tapered film can be deposited over a planar film of the same composition without an interface between the two layers. In this way the taper can reduce the thickness of the combined film to a precisely determined continuing thickness, that of the initial film. This taper configuration can be referred to as the YC taper. A region of no deposition can be disposed under a shadow mask so that a positive taper is obtained on either side of mask 209. Likewise, mask 209 can be utilized to form a well-like region in a layer of otherwise precise thickness.

Mask 209 and substrate 205 to be coated are introduced to a sputter target 204 having a substantially uniform area of target erosion as described in the '050 application and in the '863 application. Such a sputter target has an area of erosion that is larger than the substrate to be coated. The sputter source can be a planar magnetron but it should advantageously demonstrate an area of erosion adjacent to the article to be coated which is diode like in sputter erosion uniformity. It is preferred that such a sputter target sputter more than 20% of its weight as sputtered material before the non-uniformity of the film is more than about 10% of the film thickness and preferably as much as 50% of the target weight. Such a sputter source provides a uniform distribution of sputtered vapor at substrate 205. The sputter process should have a mean free path at least as long as the length of tapered region 207 to be coated or longer. A sputter pressure of 1 milliTorr is estimated to have a mean free path of about 10 cm. Consequently, a sputter pressure of 2 to 5 milliTorr will enable the mask to intercept vapor with a line of sight trajectory as far as several centimeters from the mask. In this case a layer 206 is deposited on the wafer having a film thickness which is smoothly increasing from zero thickness in the region under mask 209 to the region away from mask 209 which has a thickness similar to the thickness of layer 206 deposited with shaddow mask 209. The region of film having an increasing thickness, region 207, is said to be in the line of sight shaddow of the physical vapor. The formation of tapered thickness optical films by means of such a process lead directly to low loss, efficient mode size converting wave guides and amplifiers. See Tao Pan et al., "Gain Flattened, High Index Contrast Planar $Er^{3+}$-doped Waveguide Amplifier with an Integrated Mode Size Converter," submitted to Optical Fiber Conference, March 19-21, Anneheim Ca., 2002.

FIG. 4 shows the height G which is the spacing of the under side of mask 209 to the top of substrate 206. If this distance is more than about 1 mm, the substrate bias plasma, which is responsible for the densification and smoothing of the film, will be maintained under at least a portion of shadow mask 209. This has the advantage of smoothing and providing optical transparency to the thin portion of the tapered film.

Figure 5:
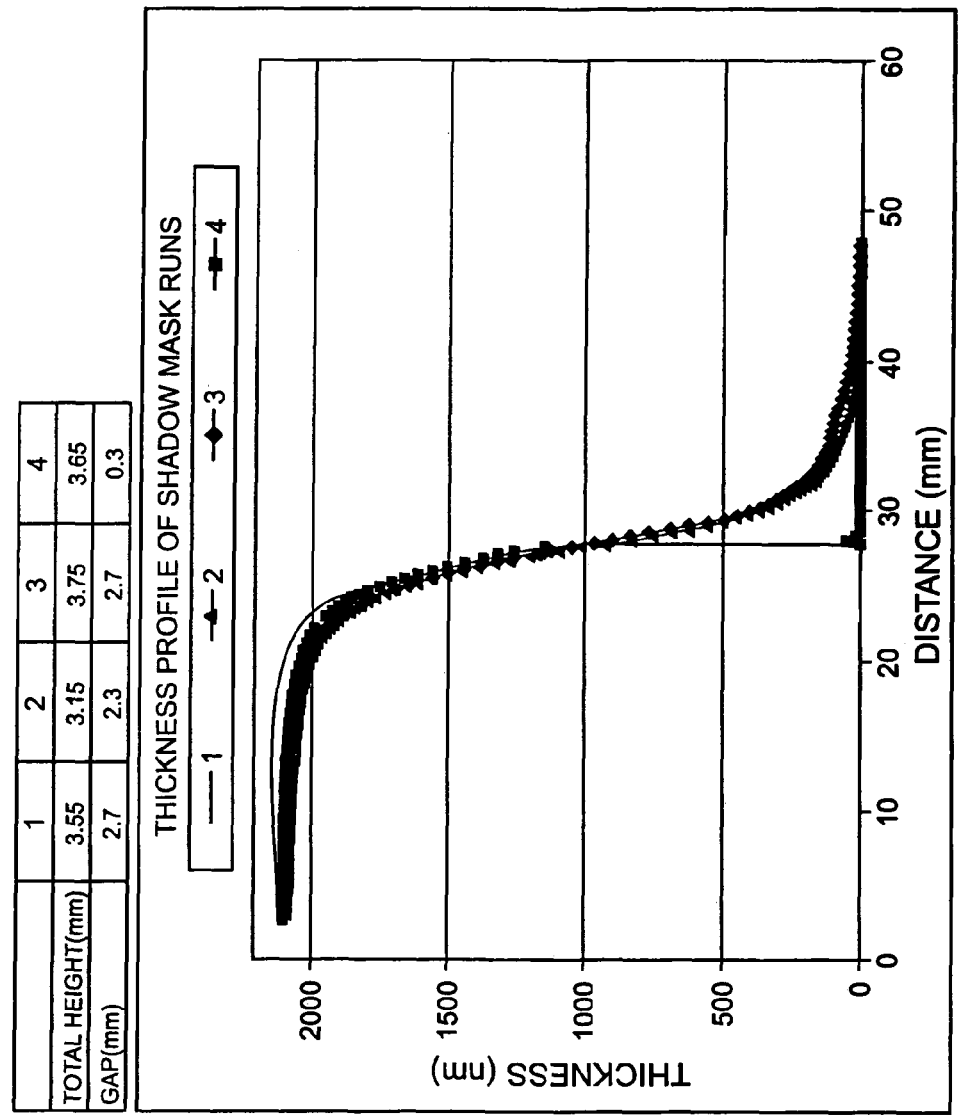
FIG. 5 shows the thickness versus distance for several tapers formed according to the present invention with different shadow mask geometries.

FIG. 5 shows the taper profile for a series of depositions of varying gap and total height values for shadow deposition according to the present invention.

Figure 6A:
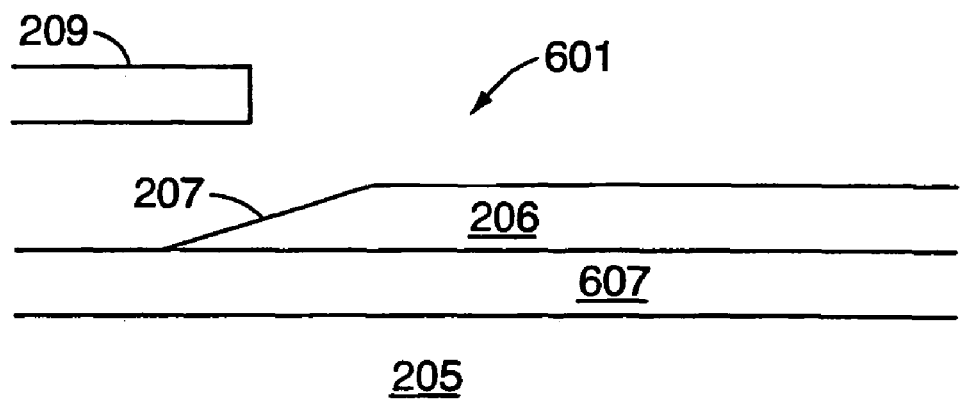
FIGS. 6A and 6B show deposition of a taper according to the present invention and a cross-sectional diagram of a waveguide device, respectively.
Figure 6B:
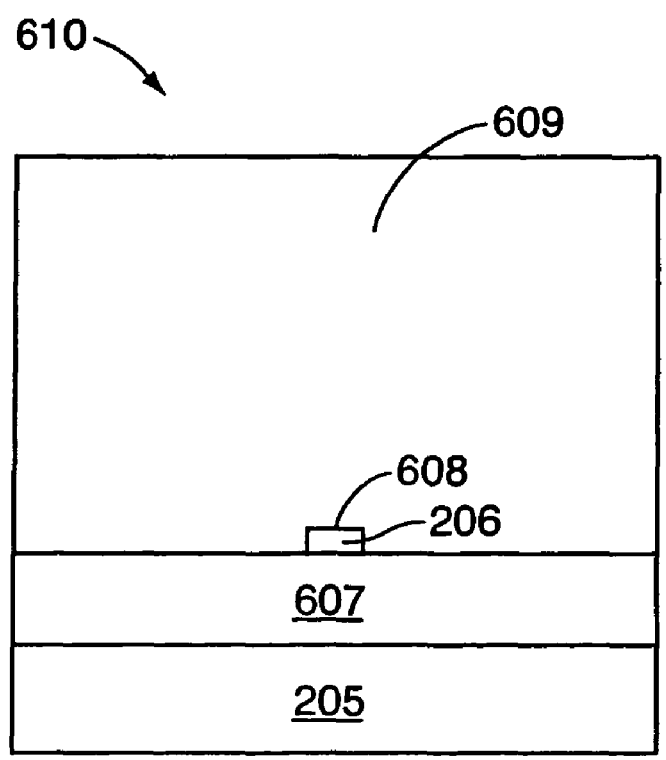

FIGS. 6A and 6B illustrate an embodiment of a tapered waveguide structure according to the present invention. FIG. 6A shows a waveguide structure 601 having core layer 206 deposited over a substrate 205. Shadow mask 209 is positioned during deposition to form tapered region 207. In some embodiments another layer 607 is formed under core layer 206. Layer 607 can, for example, be an undercladding layer or another core (either active or passive) layer. In some embodiments, for example, substrate 205 can be a silicon wafer which is thermally oxidized to form an undercladding layer 607. As shown in FIG. 6B, waveguide 608 is formed from deposited layer 206 by patterning layer 206. Deposited layer 206 can be patterned by well known standard techniques.

FIG. 6B shows a cross section of a device 610 with core 608 formed from core layer 206. An upper cladding layer 609 is then formed over layer 607 and core 608. Waveguide 608 can be formed from a passive layer, an active layer, or a combination of active and passive layers. A passive core layer can, for example, be a layer of aluminasilicate material with no optically active dopants. An active layer can, for example, be a layer of rare-earth doped aluminasilicate material. For example, erbium doped aluminasilicate can be deposited as layer 206 and patterned to form an amplifying waveguide 608. Depositions of passive layers, active layers and cladding layers of varying material properties has been described in the '863 application, the '341 application, and the '493 application.

In FIG. 6B, for example, core 608 may be formed from an active core material in layer 206. Device 610, then, can be an optical amplifier with mode-size converter coupling of light into and out of core 608. Taper 207 in layer 206 forms the mode-size converter.

Figure 7A:
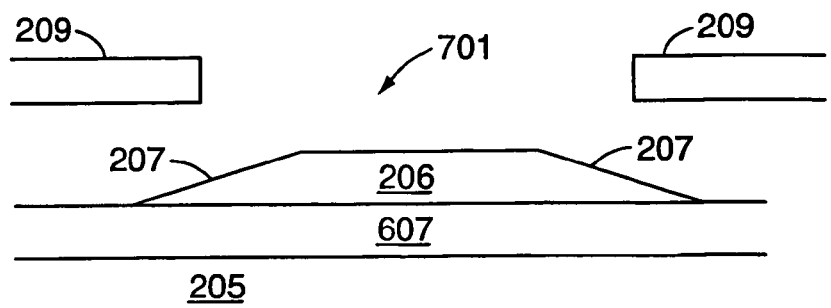
FIGS. 7A, 7B, 7C and 7D show deposition of a taper according to the present invention and a cross-sectional diagram of waveguide devices, respectively.
Figure 7B:
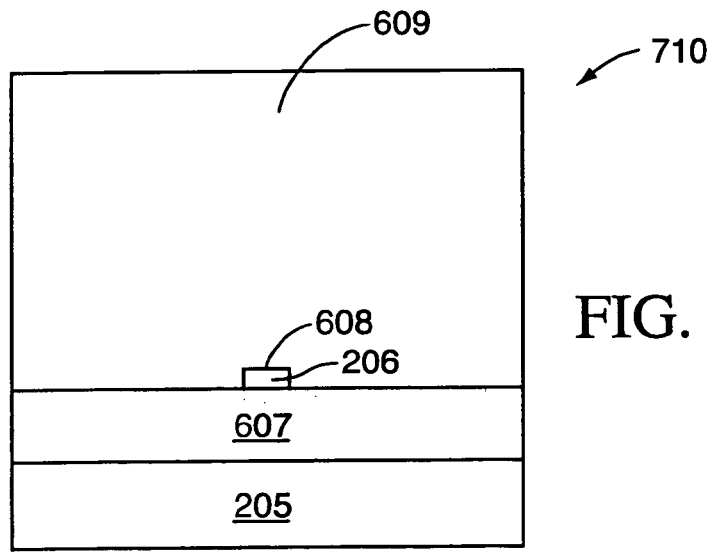
Figure 7C:
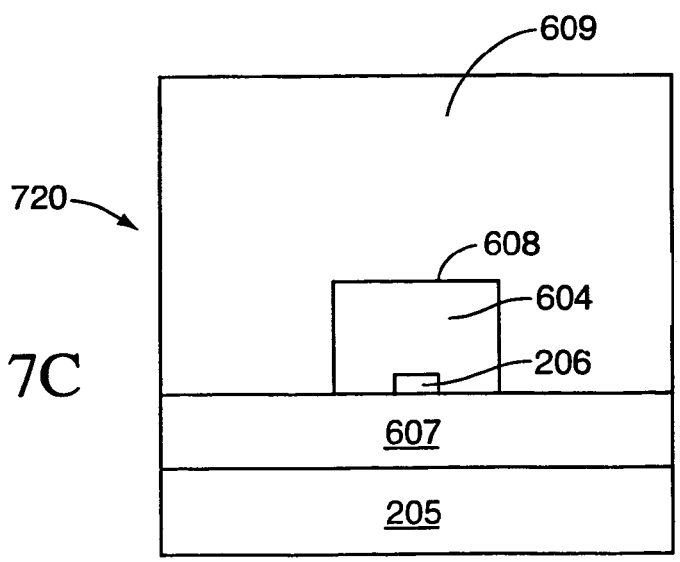

FIGS. 7A, 7B and 7C illustrate another embodiment of tapered waveguide structures according to the present invention. In FIG. 7A, structure 701 includes tapered regions 207 formed on both sides of core layer 206 by shadow masks 209. Therefore, when core layer 206 is patterned into waveguide 608 as shown in FIG. 7B, the resulting waveguide have tapered regions 207 on both sides. As shown in the cross-sectional view of device 710 formed from structure 701 in FIG. 7B. Core layer 206 is patterned to form waveguide 608 and upper cladding layer 609 is deposited over core layer 206 and undercladding layer 607.

Device 710 can couple light into and out of both sides of waveguide 608. In some embodiments, core layer 206 may be active core material and device 710 can function as an amplifier device.

FIG. 7C shows another waveguide device 720. In device 720, core layer 206 is patterned. A core layer 604 is then deposited and patterned to form core 608. Upper cladding layer 609 is then deposited over core 608. In some embodiments, core layer 206 may be an active core layer and core layer 604 can be a passive core layer. Device 720, then, can function as an amplifier.

Figure 7D:
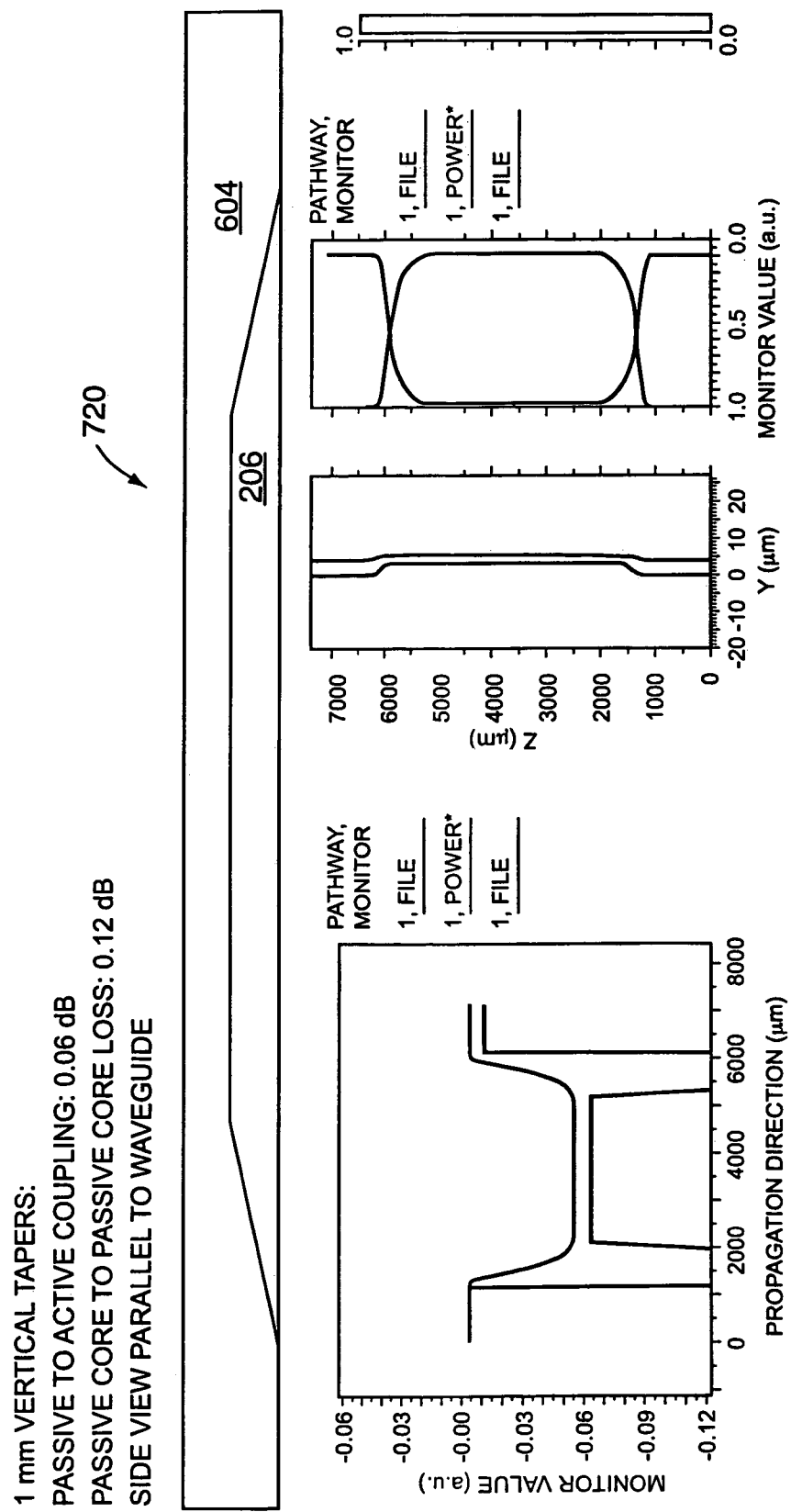

FIG. 7D illustrates device 720 and a calculation of coupling efficiency in device 720. The passive layer to active layer coupling (i.e., layer 604 into layer 206) is projected to be about 0.06 dB and the passive core to passive core loss is expected to be about 0.12 dB of modal loss. The index contrast between the active core and the cladding was 7%. Passive core 604 has a contrast of 0.5% with cladding layers. The taper length is about 1 mm.

Figure 8A:
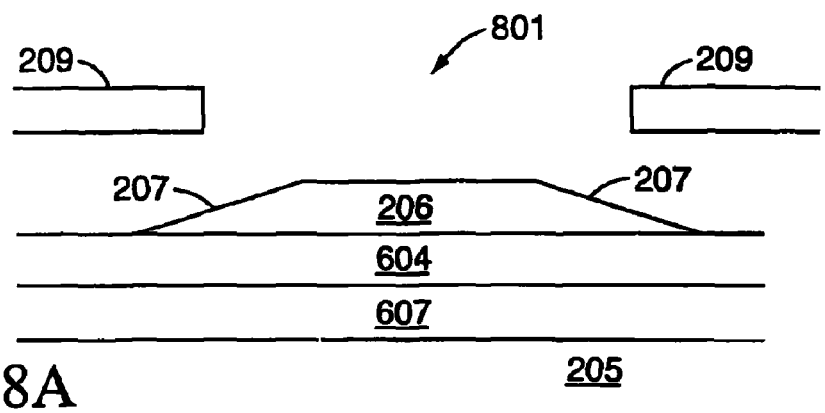
FIGS. 8A, 8B and 8C show another embodiment of a waveguide device with a taper according to the present invention.
Figure 8B:
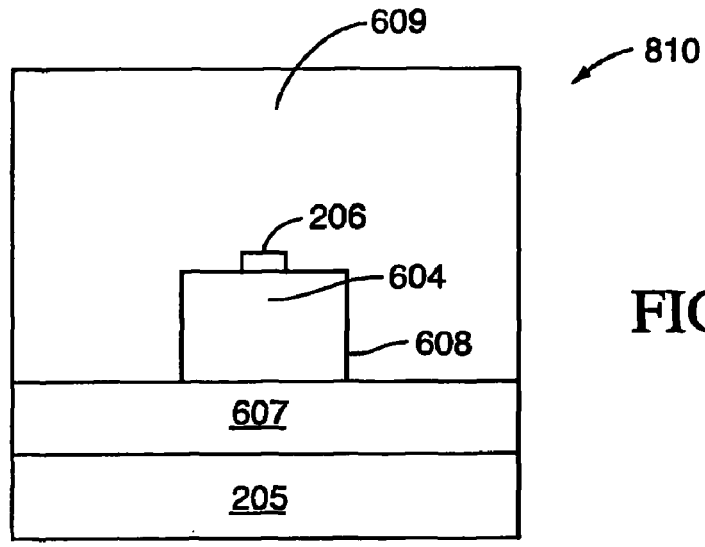
Figure 8C:
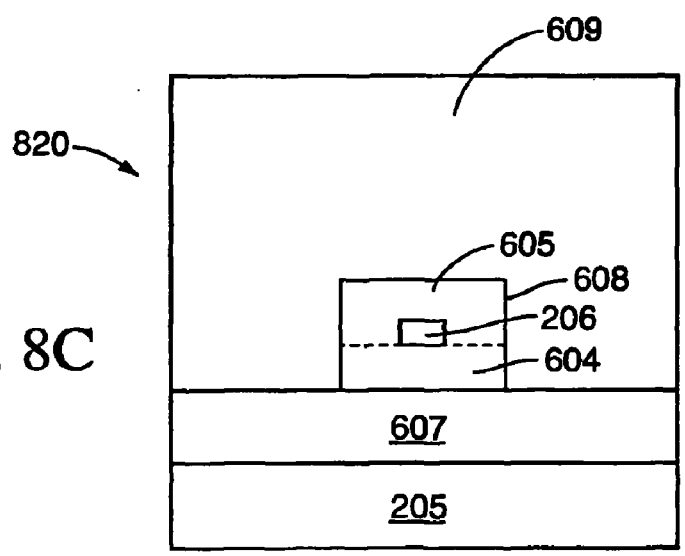

FIGS. 8A, 8B and 8C show another embodiment of a waveguide device with tapers according to the present invention. In structure 801 shown in FIG. 8A, another core layer 604 is deposited over undercladding layer 604 and core layer 206 is deposited according to the present invention over core layer 604. Core layer 604 can, for example, be an active or passive core layer.

FIG. 8B shows a cross-sectional view of waveguide device 810. In FIG. 8B, core layer 206 is patterned and then core layer 604 is patterned to form core 608. Uppercladding layer 609 is then deposited over undercladding layer 607 and core 608. In some embodiments, core layer 604 may be a passive core material and core layer 206 may be an active core material, for example erbium doped aluminasilicate, to form an amplifier structure.

FIG. 8C shows a cross-sectional view of waveguide device 820. In waveguide device 820, core layer 206 is patterned and then core layer 604 is patterned. A second core layer 605 is deposited over core layer 206 and patterned to form core 608. Uppercladding layer 609 is then deposited over core 608. In some embodiments, core layers 604 and 605 are passive core layers and core layer 206 is an active core layer. Device 820, then, can function as an amplifier.

Coupling of light between a core of a core layer 604 and a core of core layer 206 is determined by the index difference between core layer 604 and core layer 206. Light will preferentially transition to the region of higher index. Therefore, in an active core region 206 of higher index over a passive core region 604 of lower index, light will transition from passive core region 604 to active core region 206. If the vertical taper 207 of core layer 206 is long enough (for example greater than about 200 µm) and smooth enough, then the transition will be substantially adiabatic.

Figure 9A:
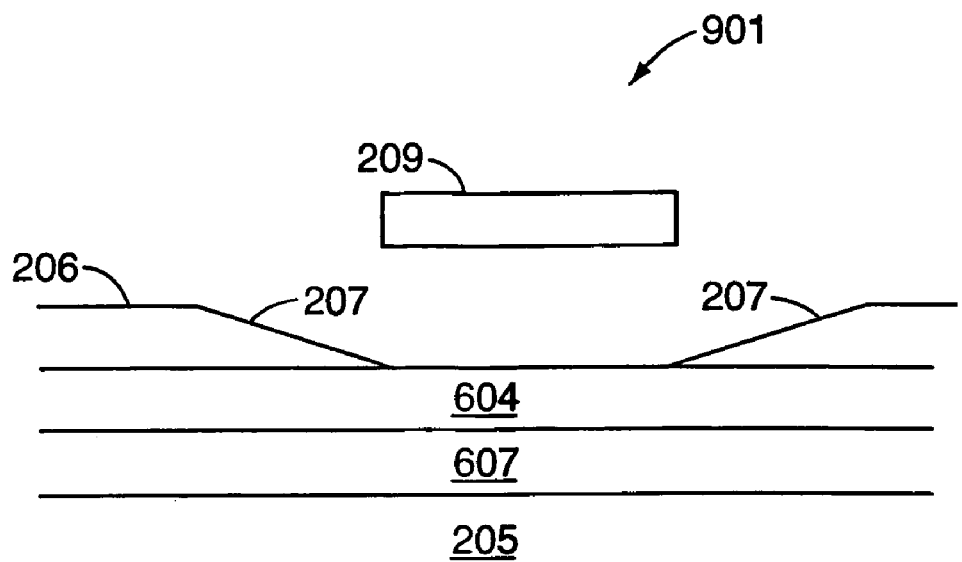
FIGS. 9A and 9B show another embodiment of a waveguide structure with a taper according to the present invention.
Figure 9B:
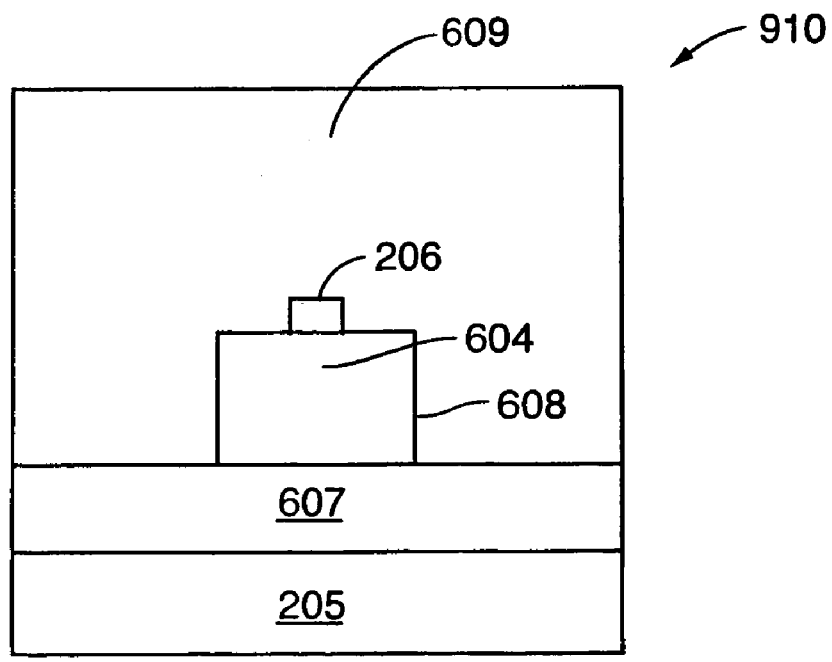

FIGS. 9A and 9B show another embodiment of a waveguide structure with a taper according to the present invention. In structure 901 shown in FIG. 9A, shadow mask 209 is positioned such that tapered regions 207 are formed in the center of layer 206. Layer 206 can, in some embodiments, be deposited over another core layer 604. Under cladding layer 607 may be deposited between cladding layer 206 and substrate 205. Structure 901 can function as a waveguide converter to couple light into and out of two fibers formed in layer 206. In some embodiments, a light source may be placed in the region between tapers 207 and light may be coupled into both sides of layer 206.

FIG. 9B shows a cross-sectional view of a waveguide device 910 formed from structure 901. Layer 206 may be patterned and then layer 604 may be patterned to form a core 608. In some embodiments, layer 604 may be absent and core 608 then includes only layer 206. Further, in some embodiments core 608 may include another core layer deposited over layer 206 and patterned to form core 608. Uppercladding layer 609 is deposited over core 608. Device 910, as was discussed above, may be utilized to couple light from photodiodes or light to photodetectors that can be mounted in substrate 205.

Figure 10:
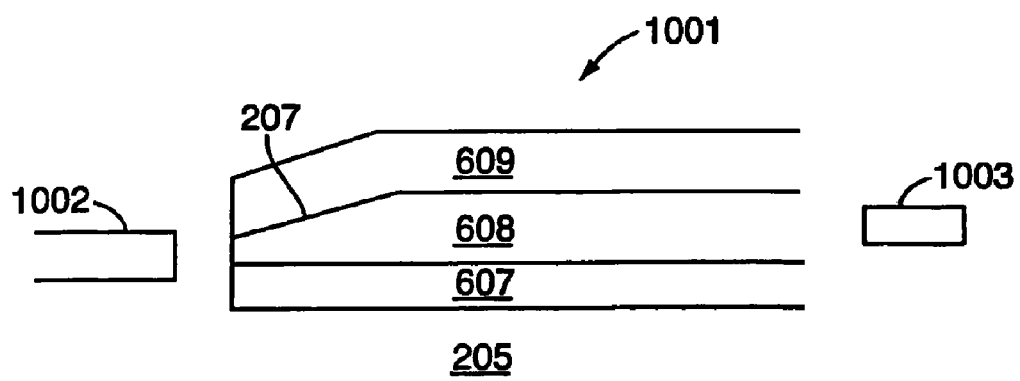
FIG. 10 shows the device illustrated in FIG. 6B utilized for coupling laser light into an optical fiber.

FIG. 10 shows device 610 shown in FIG. 6B utilized to optically couple a laser 1003 with a fiber 1002. Tapered region 207 provides mode-size conversion for coupling light out of device 610 into fiber 1002 efficiently. Such a reverse taper mode size expander can be referred to as a "TP taper". As shown in FIG. 10, in some embodiments, device 610 is polished such that layer 206 does not taper to zero. In some embodiments, layer 206 can have a high index of refraction so that the mode size of core 608 matches the mode size at the facet of laser 1003 and a high index contrast with cladding layers 607 and 609 such that the numerical aperature (NA) of laser 1003 and device 610 can be closely matched, causing light from laser 1003 to be efficiently coupled into device 610.

Figure 11:
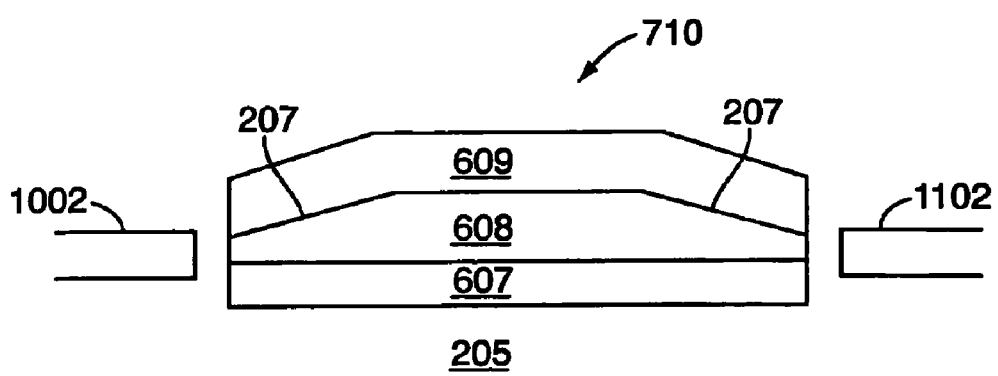
FIG. 11 shows the device illustrated in FIG. 7B utilized for coupling light into and out of two fibers.

FIG. 11 shows device 710 as shown in FIG. 7B coupled to optical fibers 1102 and 1002. Tapered regions 207 in both sides of device 710 providing mode-size conversion which can be utilized to efficiently couple light between fiber 1002 and device 710 and between fiber 1102 and device 710. In some embodiments, device 710 can function as an amplifier.

Figure 12:
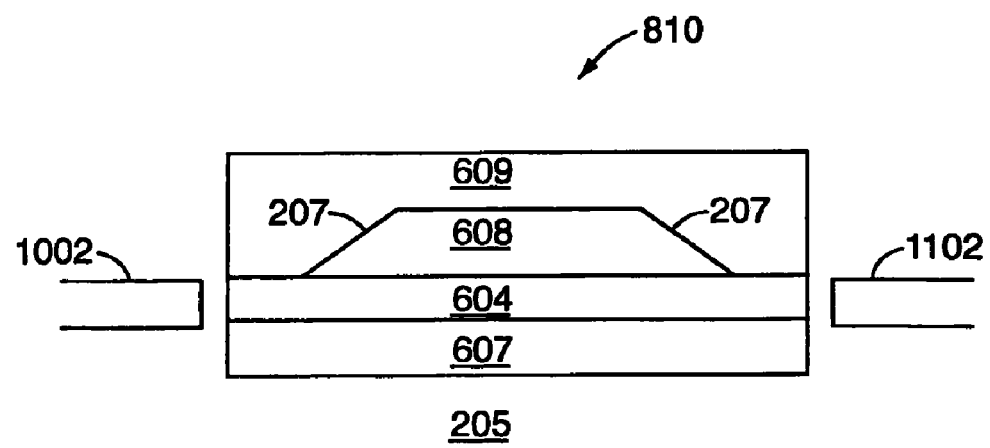
FIG. 12 shows the device illustrated in FIG. 8B coupled to two optical fibers.

FIG. 12 shows device 810 as shown in FIG. 8B coupled to optical fibers 1102 and 1002. Again, tapered regions 207 provide mode-size conversion which can efficiently couple light between fibers 1002 and 1102 and device 810. Further, device 810 may be an amplifier device. In some embodiments, layer 607 can be a low index passive core.

Figure 13:
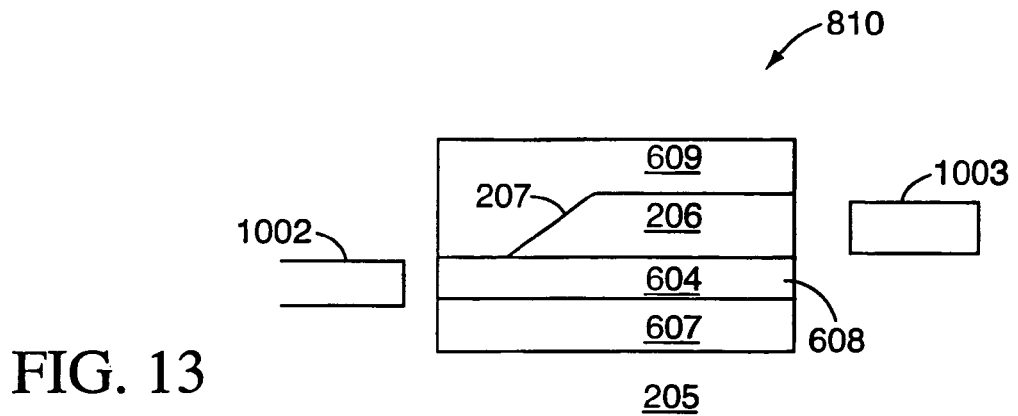
FIG. 13 shows the device illustrated in FIG. 8B coupled to an optical fiber and a laser.

FIG. 13 shows device 810 as shown in FIG. 8B having a single tapered region 207 coupled between laser 1003 and fiber 1002. Laser 1003 can be efficiently coupled into device 810 when core 608 formed of layers 206 and 604 is constructed such that the mode size of core 608 matches the mode size at the facet of laser 1003 and the numerical aperature (NA) of laser 1003 and device 610 can be closely matched.

Figure 14A:
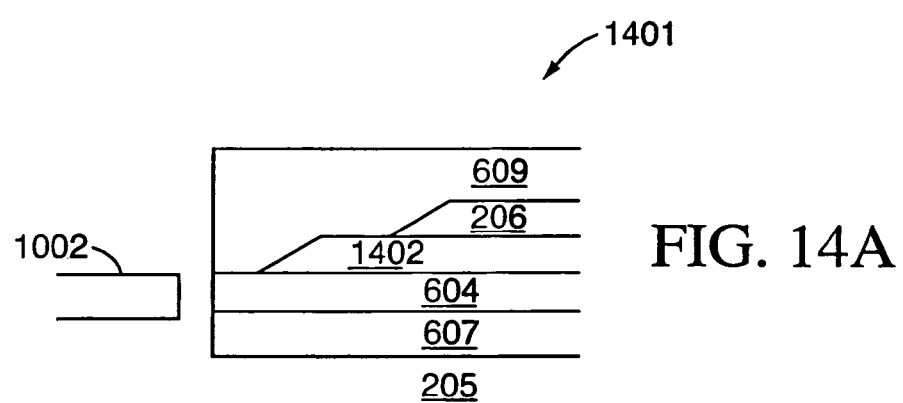
FIGS. 14A and 14B show a waveguide device according to the present invention with multiple tapered layers.
Figure 14B:
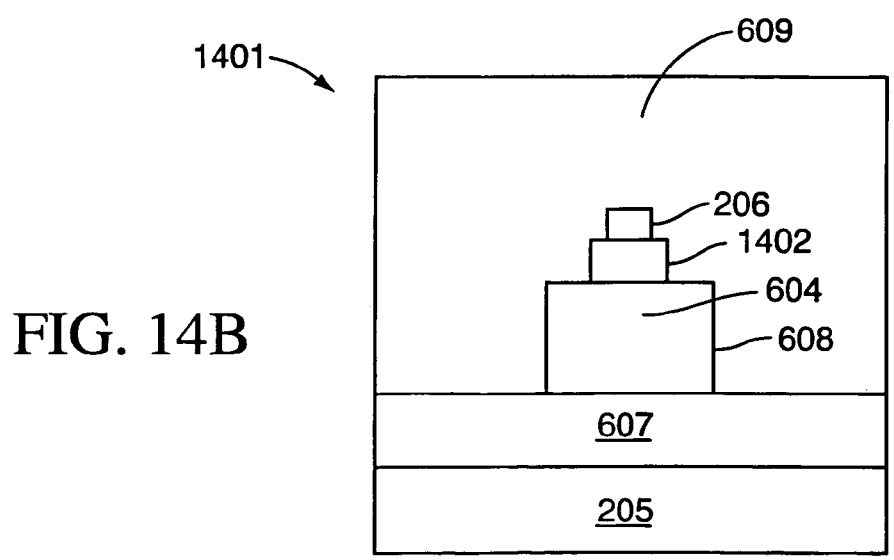

FIGS. 14A and 14B illustrate an embodiment of a waveguide device having multiple tapered core layers. As shown in FIG. 14A, under cladding layer 607 is formed on substrate 205. Optionally, a core layer 604 can be deposited over under cladding layer 604. Tapered core layer 1402 is then deposited over core layer 604. Tapered core layer 206 is then deposited over tapered core layer 1402. In general, any number of tapered core layers can be deposited. In some embodiments, another core layer may be deposited over core layer 206. Core layers 604, 1402 and 206 are then patterned to form core 608. Upper cladding layer 609 is then deposited over core layer 206 to form device 1401. FIG. 14B shows a cross section of device 1401. As is shown in Figure 1401, core 608 includes cores 604, 1402, and 206.

Figure 15:
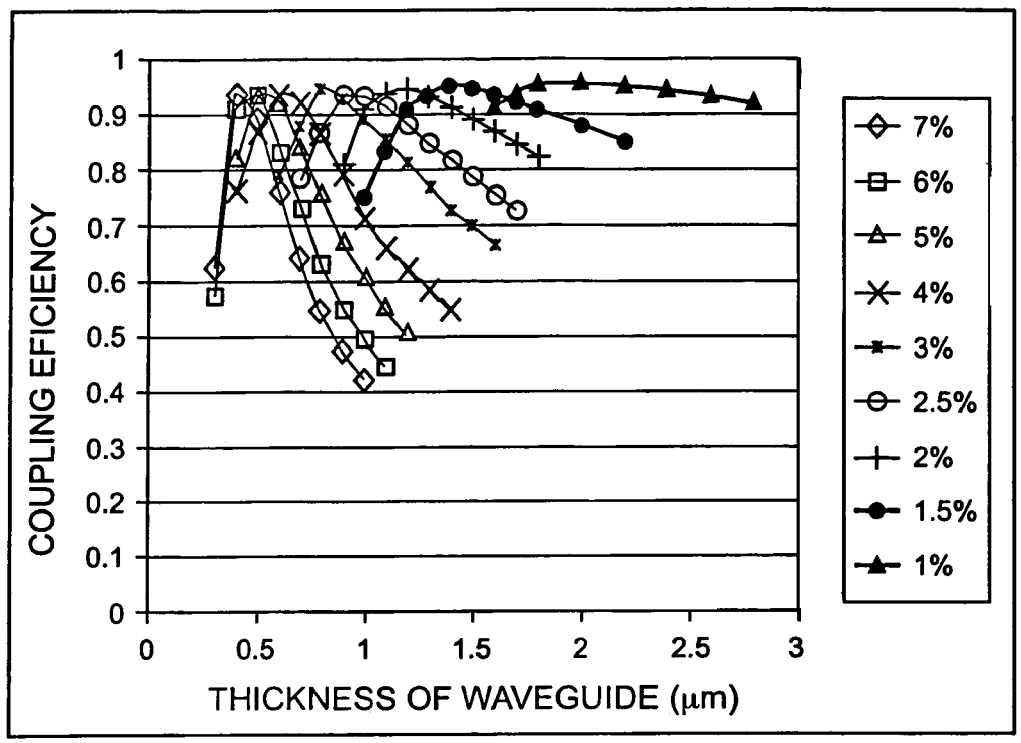
FIG. 15 shows the coupling efficiency of an embodiment of the device shown in FIG. 6B as a function of the thickness of the core for 1550 nm light.

FIG. 15 shows the coupling efficiency of an embodiment of device 610 shown in FIG. 6B. Each curve in FIG. 15 illustrates the projected coupling efficiency for a waveguide having a taper length of more than about 200 µm. Further, the calculation was done at a wavelength of 1550 nm. The mode in device 610 depends on the wavelength of light and the index of the material of core 608.

The rightmost data points in each curve assume a square, untapered, waveguide. The thickness of the thinnest portion of tapered region 207 is then reduced and the coupling efficiency is calculated. Each individual curve in FIG. 15 represents a calculation performed for a different value of index contrast between cladding layer 607 and core layer 206, for example Δn/n varying between about 1% and about 7%. FIG. 15 shows that the coupling efficiency can be optimized for each index contrast with particular taper end-point thickness.

Figure 16:
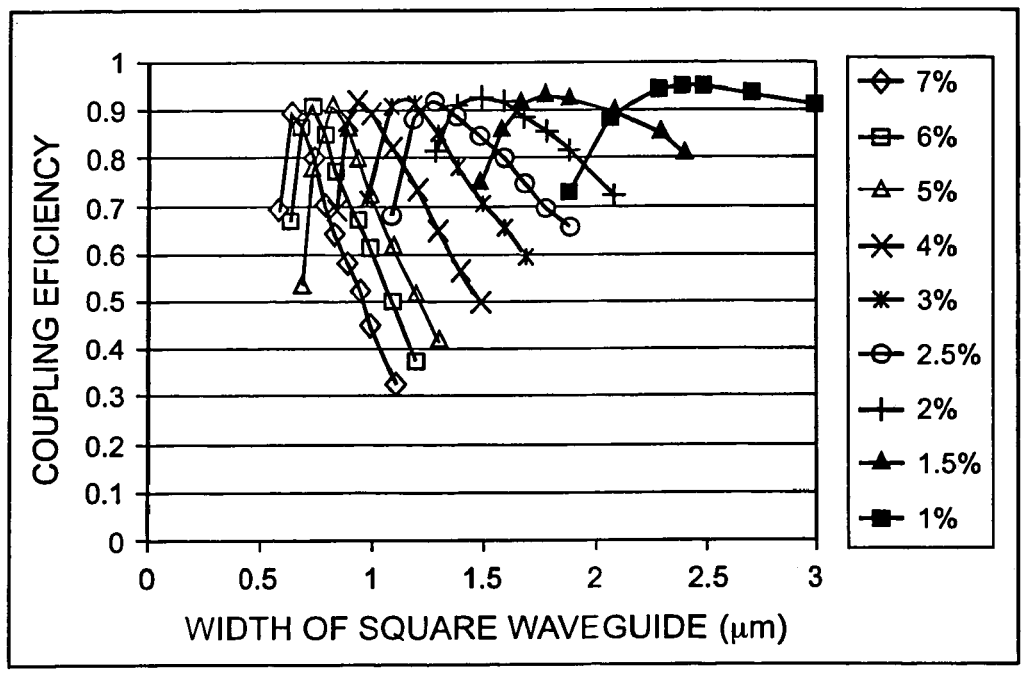
FIG. 16 shows the coupling efficiency of a waveguide having a 2-D taper according to the present invention for 1550 nm light.

FIG. 16 shows a similar calculation for a waveguide structure such as device 610 which is also tapered in the plane of substrate 205 as well as out-of-plane taper region 207. In the calculation, core 608 is square. Again, the dimensions of core 608 can be optimized for efficient coupling of light with device 610 for particular dimensions for each curve. The calculation is also undertaken at 1550 nm, as was done in the calculations shown in FIG. 15.

Figure 17:
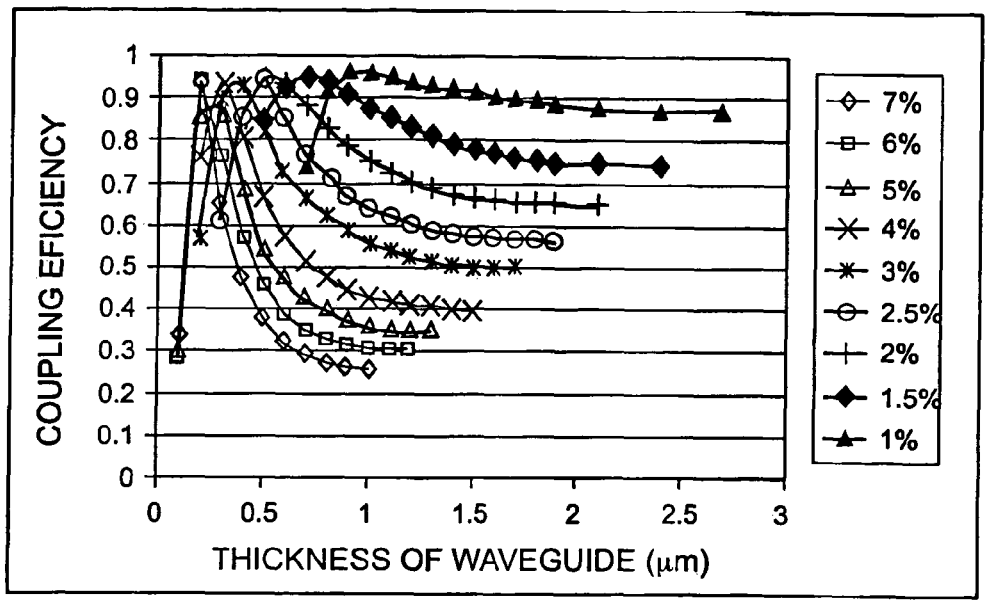
FIG. 17 shows the coupling efficiency at 980 nm for an embodiment of a taper as shown in FIG. 6A.

FIG. 17 shows the same calculation as was illustrated with FIG. 15 except for 980 nm light instead of for 1550 nm light. Again, the coupling efficiency for 980 nm light can be optimized with tapered thickness. However, the optimized taper for 980 nm light is not the same as the optimization projected for 1550 nm light.

Figure 18:
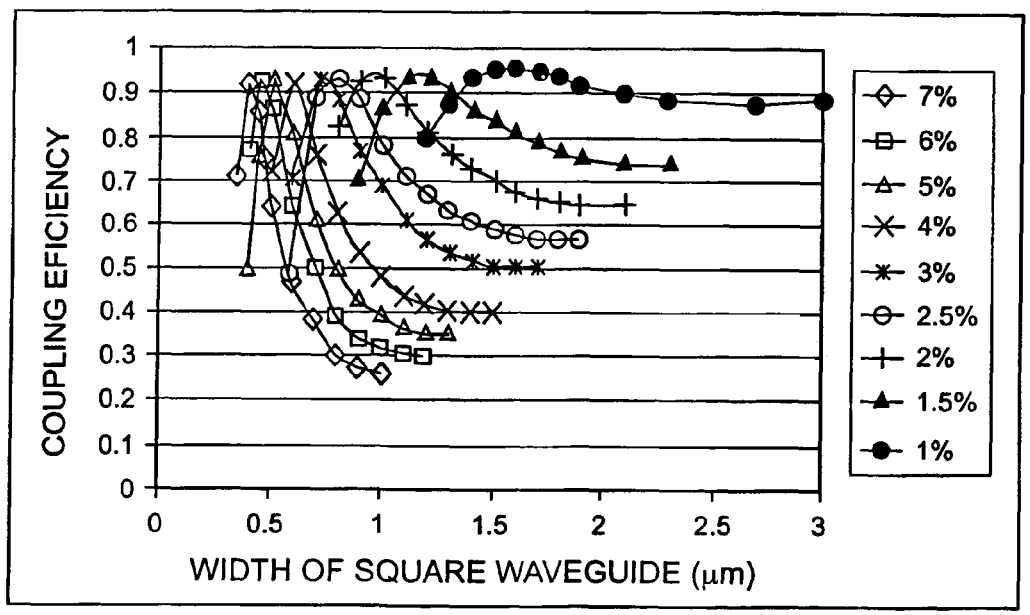
FIG. 18 shows the coupling efficiency of an embodiment of a waveguide having a 2-D taper according to the present invention at 980 nm.

FIG. 18 shows the same calculation as was illustrated with FIG. 16 except for 980 nm light instead of 1550 nm light. Again, the coupling efficiency for 980 nm light can be optimized with taper, but the optimization for 980 nm light is not the same as the optimization projected for 1550 nm light.

In one example, a YC taper was formed by reducing the thickness of a core layer 206 as is shown in FIG. 8A. Layer 604 is a thin layer of active core material with composition 1.5 cat. % erbium target deposited, for example, as described in the '245 application. Mask 209 was positioned on the order of 0.5 mm above substrate 205, resulting in a taper length of about 500 µm. Layer 206 having the same composition is deposited over layer 604. As shown in FIG. 8B, core 608 is then formed from layers 604 and 206. The indices of active core 608 cladding layers 607 and 609 are 1.511 and 1.4565, respectively. The film thickness in mode expander region (i.e., the region where layer 206 has completely disappeared) is about 0.3 µm and the total thickness in the middle of waveguide is about 1 µM. The width of core 608 is about 2.5 um. The total insertion loss at 1310 nm was measured to be only about 1.2 dB for 12 cm long waveguide, compared to 8 dB of insertion loss for about a 10 cm long waveguide without such a mode expander.

In another example of a mode size converter, as shown in FIGS. 8A and 8B, where layer 604 is a passive core layer and layer 206 is an active core layer with composition 1.0 cat. % of erbium deposited, for example, as described in the '050 application. Mask 209 was configured as discussed above in the previous example. The index of refraction of passive core 604 relative to cladding layers 607 and 609 is about 0.9%. The active core index is about 1.508. The insertion loss at 1310 for 12 cm long waveguide is about 2 dB compared to 5 dB insertion loss for 7 cm long waveguide without the mode size converter. This double-core device coupler is a wide-band coupler for 980 nm as well as 1.5 µm light.

In an example of coupling a laser to a high-index waveguide as is shown in FIGS. 10 and 13. Core 608 is a high index core with high index contrast with cladding layers 607 and 609. The high index passive core index and cladding are 1.55 and 1.4565, respectively, resulting in about a 6.4% contrast. The passive core 604 has thickness of 0.5 micron and width of about 5 micron with 28 mm in length. The laser diode was an ADC S/N 2412. The vertical and horizontal angular width (about 13% of the peak power) of this laser diode is 65 degree and 11.6 degree, respectively. The coupling efficiency from this laser diode to waveguide is more than 65%. Therefore, the present invention also relates to the integration of adiabatic mode size conversion in continuous waveguide structures having large change in index contrast. Utilizing the present invention, this coupling efficiency can be advantageously increased to between 80 and 90% between single laser die and single waveguides as well as arrays of laser dies and arrays of wavelengths.

In general, any combination of active and passive core layers with cladding layers of any relative dimensions can be deposited. Any number of tapered core layers can be utilized, having any index variation achievable. For example, symmetrical cladding (i.e., undercladding layer and uppercladding layers) can be utilized. Additionally, assymetric cladding layers can also be utilized.

The examples and embodiments discussed above are exemplary only and are not intended to be limiting. One skilled in the art can vary the processes specifically described here in various ways. Further, the theories and discussions of mechanisms presented above are for discussion only. The invention disclosed herein is not intended to be bound by any particular theory set forth by the inventors to explain the results obtained. As such, the invention is limited only by the following claims.

We claim:
1. A mode size converter, comprising:
a first layer of a dielectric material with a first refractive index deposited over a substrate;
a rare earth-doped aluminosilicate layer of a second refractive index deposited over the first layer,
wherein, the rare earth-doped aluminosilicate layer includes a vertical taper, and the vertical taper has an as-deposited average surface roughness of about 1.5 nm or less; wherein
the resulting average surface roughness is substantially as-deposited, and further having a rate of taper of about 0.14 parts per thousand.

2. The mode size converter of claim 1, wherein the first refractive index is greater than the second refractive index.

3. The mode size converter of claim 2, wherein for light traveling along the first layer into the rare earth-doped aluminosilicate layer, a mode size in the first layer is greater than a mode size in the rare earth-doped aluminosilicate layer.

4. The mode size converter of claim 1, wherein the first layer is a core layer; and
the second layer is a core layer.

5. The mode size converter of claim 4, wherein the first core layer is an active layer and the second core layer is a passive layer.

6. The mode size converter of claim 4, wherein
the first core layer is a passive layer; and
the second core layer is an active layer.

7. The mode size converter of claim 1, wherein
the first layer is an undercladding layer; and
the second layer is a core layer.

8. The mode size converter of claim 1, further comprising:
a third layer deposited over the first layer, wherein
the third layer is one of a core layer or an undercladding layer.

* * * * *